(12) United States Patent
Fernandez et al.

(10) Patent No.: US 9,664,494 B2
(45) Date of Patent: May 30, 2017

(54) MAGNETIC FIELD SENSOR WITH IMMUNITY TO EXTERNAL MAGNETIC INFLUENCES

(71) Applicant: Allegro Microsystems, LLC, Worcester, MA (US)

(72) Inventors: Devon Fernandez, Londonderry, NH (US); Paul David, Bow, NH (US); William P. Taylor, Amherst, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 440 days.

(21) Appl. No.: 13/891,519

(22) Filed: May 10, 2013

(65) Prior Publication Data

US 2014/0333295 A1    Nov. 13, 2014

(51) Int. Cl.
  *G01B 7/30*    (2006.01)
  *G01B 7/00*    (2006.01)
  *G01R 33/00*   (2006.01)

(52) U.S. Cl.
  CPC .......... *G01B 7/003* (2013.01); *G01R 33/0023* (2013.01)

(58) Field of Classification Search
  CPC ...... G01R 33/0023; G01B 7/003; G01B 7/14; G01B 7/30
  USPC ............................................ 324/207.12, 225
  See application file for complete search history.

(56) References Cited

U.S. PATENT DOCUMENTS

| | | | |
|---|---|---|---|
| 5,581,179 | A | 12/1996 | Engel et al. |
| 6,043,646 | A | 3/2000 | Jansseune |
| 6,265,865 | B1 | 7/2001 | Engel et al. |
| 6,504,363 | B1 | 1/2003 | Dogaru et al. |

(Continued)

FOREIGN PATENT DOCUMENTS

| | | |
|---|---|---|
| JP | H11-101861 | 4/1999 |
| JP | 2006-284466 | 10/2006 |

(Continued)

OTHER PUBLICATIONS

International Preliminary Report on Patentability dated Nov. 19, 2015 for PCT Application No. PCT/US2014/035594; 13 pages.

(Continued)

*Primary Examiner* — Jay Patidar
(74) *Attorney, Agent, or Firm* — Daly, Crowley, Mofford & Durkee, LLP

(57) ABSTRACT

A magnetic field sensor with enhanced immunity to external magnetic interference is presented. Included is a magnetic field signal generator and a demodulator. The magnetic field signal generator produces a magnetic field signal having a modulated signal portion in a first frequency band based on a sensed modulated AC bias magnetic field. The modulated AC bias magnetic field is produced by movement of ferromagnetic target relative to a bias coil when an AC signal is applied to the bias coil. When the magnetic field signal also includes an unwanted signal portion in a second frequency band based on external magnetic interference, demodulation performed by the demodulator results in the modulated signal portion being shifted from the first frequency band to a third frequency band and the unwanted signal portion being shifted to the first frequency band. The bias coil may be provided as part of the magnetic field sensor.

27 Claims, 12 Drawing Sheets

(56) References Cited

U.S. PATENT DOCUMENTS

| | | |
|---|---|---|
| 6,566,872 B1 * | 5/2003 | Sugitani .................. G01R 33/02 324/249 |
| 7,112,955 B2 | 9/2006 | Buchhold |
| 7,112,957 B2 | 9/2006 | Bicking |
| 7,385,394 B2 | 6/2008 | Auburger et al. |
| 7,816,772 B2 * | 10/2010 | Engel et al. .................. 257/676 |
| 7,839,141 B2 | 11/2010 | Werth et al. |
| 7,956,604 B2 | 6/2011 | Ausserlechner |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,654 B2 | 1/2012 | Theuss et al. |
| 8,253,210 B2 | 8/2012 | Theuss et al. |
| 8,362,579 B2 | 1/2013 | Theuss et al. |
| 8,542,010 B2 | 9/2013 | Cesaretti et al. |
| 8,610,430 B2 | 12/2013 | Werth et al. |
| 8,773,124 B2 | 7/2014 | Ausserlechner |
| 9,116,018 B2 | 8/2015 | Frachon |
| 9,164,156 B2 | 10/2015 | Elian et al. |
| 9,201,123 B2 | 12/2015 | Elian et al. |
| 2004/0257894 A1 * | 12/2004 | Onogi et al. .................. 365/202 |
| 2007/0247141 A1 | 10/2007 | Pastre et al. |
| 2010/0211347 A1 | 8/2010 | Friedrich et al. |
| 2011/0018533 A1 | 1/2011 | Cesaretti et al. |
| 2011/0127998 A1 | 6/2011 | Elian et al. |
| 2011/0267040 A1 | 11/2011 | Frachon |
| 2012/0274314 A1 | 11/2012 | Cesaretti et al. |
| 2013/0278246 A1 | 10/2013 | Stegerer et al. |
| 2013/0300401 A1 | 11/2013 | Krapf et al. |

FOREIGN PATENT DOCUMENTS

| | | |
|---|---|---|
| WO | WO 2007/095971 A1 | 8/2007 |
| WO | WO2014/105302 | 7/2014 |

OTHER PUBLICATIONS

Ahn et al.; "A New Toroidal-Meander Type Integrated Inductor With a Multilevel Magnetic Core", IEEE Transactions on Magnetics, vol. 30, No. 1, Jan. 1994, pp. 73-79.

Park et al.; "Ferrite-Based Integrated Planar Inductors and Transformers Fabricated at Low Temperature", IEEE Transactions on Magnetics, vol. 33, No. 5, Sep. 1997, pp. 3322-3324.

Park et al.; "Batch-Fabricated Microinductors with Electroplated Magnetically Anisotropic and Laminated Alloy Cores", IEEE transactions on Magnetics, vol. 35, No. 5, Sep. 1999, pp. 4291-4300.

Smith, et al.; "Part 1: The Theory of Solid-State Magnetic Sensing", Sensors, Sep. 1999, http://archives.sensormag.com/articles/0999/76/main.shtml, 8 pages.

Smith, et al.; "Part 2: The Theory of Solid-State Magnetic Sensing", Sensors, Oct. 1999, http://archives.sensormag.com/articles/1099/84/main.shtml, 11 pages.

U.S. Appl. No. 13/468,478, filed May 10, 2012, entitled "Methods and Apparatus for Magnetic Sensor Having Integrated Coil", 24 pages.

U.S. Appl. No. 13/748,999, filed Jan. 24, 2013, entitled "Magnetic Field Sensor Integrated Circuit with Integral Ferromagnetic Material", 95 pages.

International Search Report and Written Opinion dated Sep. 12, 2014 for PCT Application PCT/US2014/035594; 16 pages.

Response to the Written Opinion dated Jun. 20, 2016 for EP Application No. 14726492.3; 19 Pages.

* cited by examiner

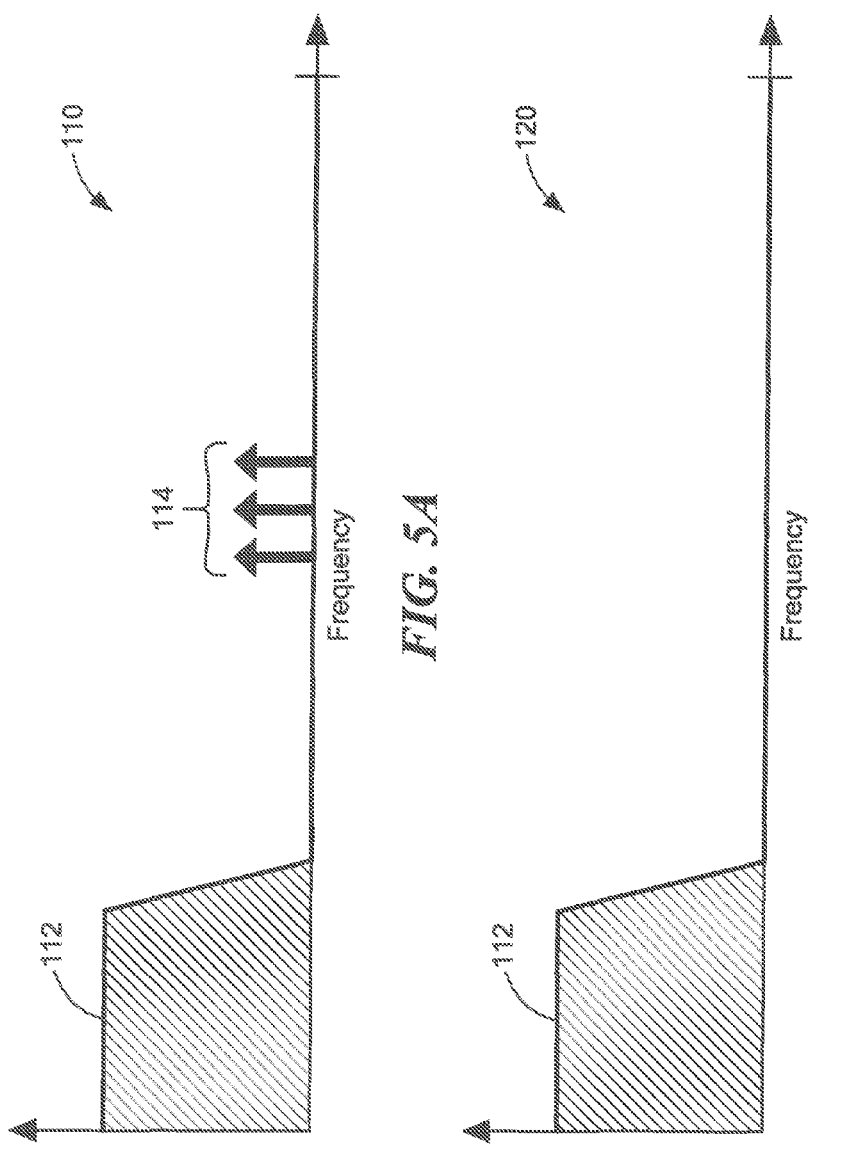

MAGNETIC FIELD SENSOR WITH IMMUNITY TO EXTERNAL MAGNETIC INFLUENCES

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to sensors and more particularly, to sensors that utilize magnetic field sensing elements to detect relative motion of ferromagnetic objects.

BACKGROUND OF THE INVENTION

Magnetic field sensors that detect the motion of a moveable target are known. The target can be a hard ferromagnetic (permanent magnet) or a soft ferromagnetic target. Magnetic field sensors that detect the features of a ferromagnetic gear target belong to a class of sensors sometimes referred to as "gear tooth sensors," Gear tooth sensors are key elements in engine management applications, anti-lock braking systems, transmission systems, and other industrial or automotive systems.

In this type of magnetic field sensor, the magnetic field associated with the target's mechanical profile is sensed by a magnetic field sensing element, such as a Hall element or magnetoresistive (MR) element. When the target is a soft ferromagnetic material, a direct current (DC) bias magnetic field is provided to the sensing element, typically by positioning a permanent magnet near the sensor. The DC bias magnetic field is a static, or zero-frequency, magnetic field. As the target's features pass the sensing element, the magnetic field experienced by the sensing element varies in relation to the target profile. The sensing element senses the magnetic field as it changes and produces a signal proportional to the sensed magnetic field. Typically, when the target has a repeating pattern of features (such as teeth and valleys of a toothed gear), the magnetic field signal produced by the sensor will take the form of a sinusoidal signal.

Some sensors process the magnetic field signal to generate an output signal that changes state each time the magnetic field signal crosses a threshold. Such an output signal may be used to determine information such as rotational speed for a rotating target.

SUMMARY OF THE INVENTION

In general, in one aspect, the invention is directed to a magnetic field sensor. The magnetic field sensor includes an AC bias coil to generate an AC hiss magnetic field capable of being modulated by movement of a ferromagnetic target with respect to the AC bias coil. The magnetic field sensor further includes a magnetic field signal generator comprising at least one sensing element to sense the modulated AC bias magnetic field and produce a magnetic field signal having a modulated signal portion in a first frequency band based on the sensed modulated AC bias magnetic field. Also included is circuitry including a demodulator to perform a demodulation of the magnetic field signal. When the magnetic field signal further includes an unwanted signal portion in a second frequency band based on a magnetic field interference, the demodulation results in the modulated signal portion being shifted from the first frequency band to a third frequency band and the unwanted signal portion being shifted to the that frequency band from the second frequency band.

Embodiments of the invention may include one or more of the following features.

The third frequency range can include DC. The demodulator can further include a filter to remove the unwanted signal portion from the magnetic field signal after the unwanted signal portion has been shifted to the first frequency band. The circuitry can operate to produce a sensor output signal based on the magnetic field signal after demodulation. The magnetic field sensor can further include a coil driver, coupled between a supply input and the AC bias coil, to provide an AC signal to the AC bias coil. It can also be provided with a frequency select input to allow the frequency of the AC signal to be adjusted by an external application. The magnetic field sensor can further include a frequency controller, coupled to the coil driver, to provide a frequency select signal based on a frequency selection to the coil driver for adjusting the frequency of the AC signal. The frequency controller can be configured to receive the magnetic field signal after demodulation following multiple frequency adjustments and modify the frequency selection. The frequency can be set so that the first frequency range excludes frequencies associated with the magnetic interference in the second frequency band.

The AC bias coil, magnetic field signal generator and circuitry can be provided on a semiconductor die. The AC bias coil can be a planar spiral coil.

The magnetic field signal generator and circuitry can be provided on a semiconductor die, and the magnetic field sensor can further include a package that includes a lead frame coupled to the semiconductor die and located between the semiconductor die and the AC bias coil, and a package body to enclose the semiconductor die, at least a portion of the lead frame and the AC bias coil together. The AC bias coil can be a solenoid type coil. The solenoid type coil can include a soft ferromagnetic core to concentrate the AC bias magnetic field. The package body can include a mold portion to enclose the die, at least a portion of the lead frame and the AC bias coil. Alternatively, the package body can include a first mold portion to enclose the die and at least a portion of the lead frame and a second mold portion to enclose the AC bias coil. The second mold portion can comprise a ferromagnetic mold material.

The at least one sensing element can be a selected one of a Hall-effect element, magnetoresistance (MR) element or other type of magnetic field sensitive element. The material used to implement the at least one sensing element is a selected one of type IV semiconductor material or a type III-V semiconductor material.

In another aspect, the invention is directed to a magnetic field sensor. The magnetic field sensor includes a magnetic field signal generator comprising at least one sensing element to sense a modulated AC bias magnetic field and produce a magnetic field signal, the magnetic field signal having a modulated signal portion in a first frequency band based on the sensed modulated AC bias magnetic field. Also included is circuitry including a demodulator to perform a demodulation of the magnetic field signal. When the magnetic field signal further includes an unwanted signal portion in a second frequency band based on a magnetic interference, the demodulation results in the modulated signal portion being shifted from a first frequency band to a third frequency band and the unwanted signal portion being shifted to the first frequency band from the second frequency band.

In yet another aspect, the invention is directed to a method. The method includes: producing a magnetic field signal comprising a modulated signal portion in a first frequency band based on sensing a modulated AC bias magnetic field and an unwanted signal portion in a second frequency band based on sensing a magnetic interference; and performing a demodulation of the magnetic field signal to shift the modulated signal portion from the first frequency band to a third frequency band and the unwanted signal portion to the first frequency band from the second frequency band.

BRIEF DESCRIPTION OF THE DRAWINGS

The foregoing features of the invention, as well as the invention itself, may be more fully understood from the following detailed description of the drawings, in which:

FIGS. 5A-5B show diagrams of a frequency domain representation of demodulation at a mixer output (FIG. 5A) and after a subsequent filtering (FIG. 5B);

DETAILED DESCRIPTION

Figure 1:
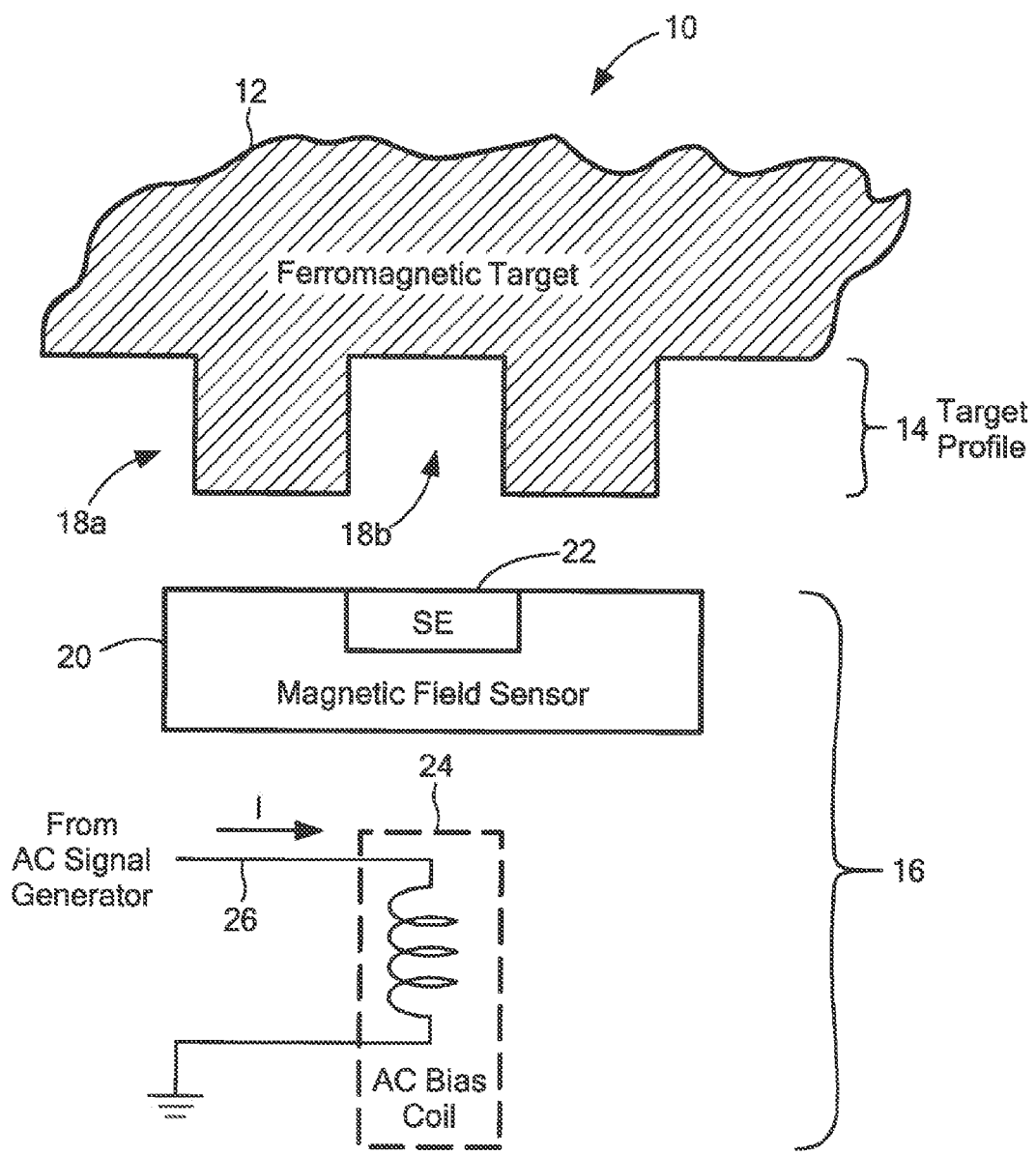
FIG. 1 shows a diagram of an exemplary magnetic field sensing arrangement including an AC bias coil and magnetic field sensor to detect features of a ferromagnetic target.

Described herein are magnetic field sensing arrangements that utilize an alternating current ("AC") bias magnetic field modulation and demodulation scheme to avoid the effects of unwanted magnetic influences.

Before describing such arrangements, some information is provided.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a spin-valve type. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

External magnetic interference can adversely affect the performance of a magnetic field sensor, particularly in gear tooth sensor application. Potential sources of magnetic interference include current carrying wires, firing of inductive ignition coils, operation of electric motors, ground-based magnets and other magnetic field sensors. In high sensitivity applications, for example, those using GMR type magnetic field sensing elements, additional sources of magnetic interference are of concern, including the earth's magnetic field.

Much of this magnetic interference contains information in frequencies near direct current (DC), that is, zero frequency. When a DC bias magnetic field is used in conjunction with a magnetic field sensor to detect a ferromagnetic target's profile (i.e., the "information of interest"), the sensing of the DC bias magnetic field, as altered by the changes caused by movement of the target relative to the sensor, is susceptible to magnetic interference occurring at frequencies near DC. Since the signal voltage produced by the transducer can vary within a range that includes DC and near DC values, removing unwanted interference from the sensed signal by frequency discrimination is generally not practical. If magnetic field sensing elements are used in pairs in a differential sensing arrangement to produce a difference signal, the unwanted interference is cancelled for the most part. For a single-point (non-differential) sensing configuration, however, the problem of removing or reducing unwanted, low frequency magnetic interference requires a different approach.

To that end, a non-DC biasing arrangement of the present invention employs a bias magnetic field in a low interference frequency band for target information modulation. Referring to FIG. 1, a simple, conceptual-level depiction of an exemplary ferromagnetic target sensing application 10 that utilizes an AC bias magnetic field is shown. The application 10 includes a ferromagnetic target 12 having a target profile 14 and a magnetic field sensing arrangement 16. The target profile 14, which can be made of a soft or hard ferromagnetic material, can be defined by an alternating pattern of a raised feature 18a (e.g., a tooth) followed by a gap 18b, typically referred to as a valley, recess or notch. The profile features can have various shapes based on design requirements. A target profile pattern such as the one shown in FIG. 1 may be provided along the circumference of a rotating target, e.g., a rotating ferromagnetic object such as a toothed gear wheel, either radially (i.e., along the outer rim or edge of the gear) or axially. More generally, the target profile pattern may be any pattern that results in a change in the presentation of ferromagnetic material (such as 'presence' and 'absence' of ferromagnetic material) or the presentation of different magnetic polarities. For example, the application could instead use magnetic domains of a ring magnet or a stamped target (with punched out portions for gaps) in an axial sensing arrangement. For hard magnetic targets with different magnetization directions, the target features may be magnetic only or may be both mechanical and magnetic. Accordingly, it will be appreciated that the target profile can comprise a pattern of mechanical and/or magnetic features.

Still referring to FIG. 1, the magnetic field sensing arrangement 16 includes a magnetic field sensor 20 having at least one magnetic field sensing element (or simply, "sensing element" or "SE") 22 or transducer. Also included in the arrangement 16 is an AC bias element in the form of a magnetic or inductive source, e.g., a conductive coil shown as an AC bias coil 24. When an AC signal is applied to the AC bias coil 24 by an AC signal generator (not shown) via a coil input line 26, current flowing through the coil 24 produces a continuous, alternating magnetic field referred to herein as an AC bias magnetic field. The frequency of the AC bias magnetic field is determined by the frequency of the AC signal. The strength of the magnetic field is determined by the amount of the current flowing through the coil, design of the coil (e.g., number of coil turns) and other features of the magnetic circuit, for example, the presence or absence of a concentrator or magnetic flux guide.

The AC bias coil 24 may be attached to or positioned near the magnetic field sensor 20. Alternatively, the AC bias coil 24 may be incorporated into the design of the magnetic field sensor 20 in some fashion, as will be described later.

As discussed in the Background, a sensing arrangement in which target features made of a soft ferromagnetic material are to be detected requires some type of magnetic biasing to provide a magnetic field. In the illustrated arrangement 10 of FIG. 1, the magnetic field is the AC bias magnetic field provided by the AC bias coil 24. As the target profile 14 passes the magnetic field sensor 20 it alters the AC bias magnetic field generated by the AC bias coil 24. The magnetic field sensing element 22 senses the magnetic field resulting from the magnetic interaction of the coil-generated magnetic field with target profile 14 and converts that field to a magnetic field signal. The magnetic field can be detected for different types of sensing applications. Exemplary sensing applications include speed, direction and position sensing.

The AC bias current can be provided by an external AC source, as shown in FIG. 1, or by the magnetic field sensor 20, as will be described later. If a DC power source is used, an AC output can be produced from the DC input (supply voltage) with various techniques, e.g., using an inverter (oscillator circuit). The generated AC signal can have different wave shapes (such as sinusoidal sine waves or non-sinusoidal waves such as square, sawtooth or triangular shaped waveforms) and different frequencies as well.

The physical orientation of the AC bias coil 24 relative to the target profile 14 can vary based on a variety of factors, such as shape and size of the coil, amount of bias current, type of the sensing element, etc. In general, the sensing arrangement 16 must permit movement of the target profile relative to the sensor 20 to produce a change in the magnetic field that can be sensed by the sensing element 22 with appropriate sensitivity.

Details of the AC modulation will now be described. Using conventional signal modulation terminology, the pattern presented by the target profile serves as the modulating "baseband" and the AC bias magnetic field serves as the "carrier." Modulation is performed with respect to the carrier. The baseband is carried by or impressed on the carrier by modulating the amplitude of the carrier. The frequency of the carrier is the "carrier frequency" or $f_c$.

In this instance, the target profile pattern (baseband) modulates the magnetic field (carrier) to produce a modulated magnetic field. The modulating pattern, when it interacts with the carrier magnetic field, modulates the amplitude of the carrier to produce an amplitude-modulated AC bias magnetic field. The AC bias magnetic field, or more specifically, the magnitude of the AC bias magnetic field, is amplitude-modulated according to the geometry of the target profile in the case of a mechanically toothed target. Here, the AC bias magnetic field is generated by a coil when an AC signal is applied to the coil. The frequency of the AC signal establishes the carrier frequency. As a result of modulation with an AC driven bias magnetic field at the carrier frequency, the information of interest is shifted from DC (more specifically, a frequency range or band that includes DC and near DC frequencies) to a higher frequency band. The carrier frequency $f_c$, is selected to be a high enough frequency to move the information of interest to a different, higher frequency band than the one containing the types of lower frequency magnetic interference mentioned above. The carrier frequency may be fixed or variable. A variable (or adjustable) carrier frequency may be varied over time, for example, in order to prevent the carrier from coinciding with any fixed frequency interference.

More specifically, the magnetic field signal produced by sensing element 22 (FIG. 1) will include a first component or signal portion corresponding to the modulated AC bias magnetic field (that is, the "modulated signal portion" containing "the information of interest"—the information indicative of the target profile). The magnetic field signal may also include a second component or signal portion ("unwanted signal portion") corresponding to magnetic field from any sources of low frequency magnetic interference present. The first signal portion is contained in a first frequency band (having been modulated to that frequency band from DC based on the carrier frequency). The second signal portion, if present, is contained in a second frequency band which is different from and has a lower range of frequencies than the first frequency band. The carrier frequency may be selected so that the first frequency band is high enough to avoid overlapping the second frequency band. To give one example, the second frequency band may have a range of frequencies between 0 Hz and 1 kHz based on potential sources of low frequency magnetic interference and the carrier frequency may be selected so that the first frequency band has a range of frequencies between 180 kHz and 220 kHz.

Once the magnetic field signal is separated into these two signal components in this manner, it is possible to use demodulation and filtering techniques to produce a magnetic field signal that contains only the desired target profile information of interest of the first component at DC, that is, a "signal of interest" in the form of a sinusoidal signal indicative of the target's profile. Again, the signal may vary within a frequency band or range that includes DC and near DC values. This frequency band is referred to herein as a "third frequency band." Once the signal of interest has been generated, it can be further processed to obtain additional information, e.g., it can be processed for speed and/or direction determination. More generally, the third-frequency band can include DC and/or near DC values. Embodiments that utilize a third frequency band corresponding to other frequency ranges are contemplated as well.

Although this type of modulation scheme is advantageous for single-point (non-differential) type sensing, which is susceptible to low frequency magnetic interference (as noted earlier), it can be used for differential sensing as well. More generally, the techniques and circuitry presented herein are applicable to any sensing application that employs a biasing magnetic field.

Figure 2A:
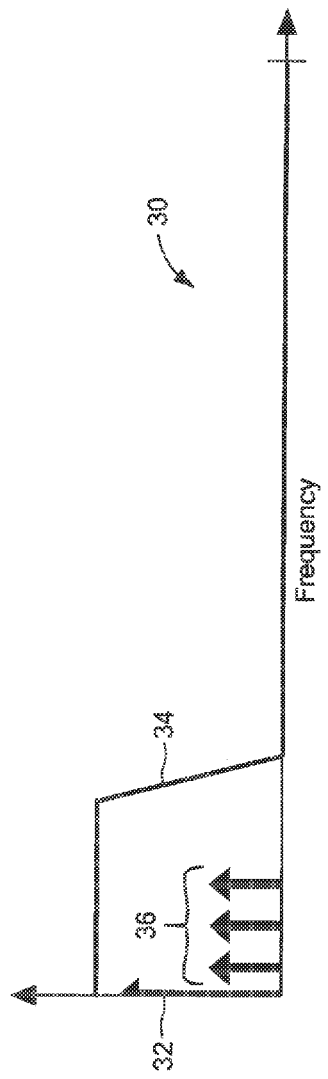
FIGS. 2A-2B show diagrams of a frequency domain representation of sensing for a DC bias magnetic field (FIG. 2A) and an AC bias magnetic field (FIG. 2B)
Figure 2B:
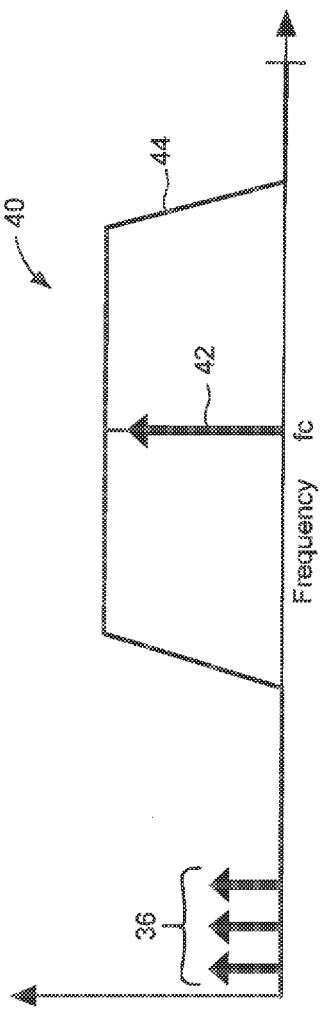

FIGS. 2A and 2B illustrate the differences in sensing with a conventional DC bias magnetic field (FIG. 2A) and an AC bias magnetic field (FIG. 2B). With reference to FIG. 2A, a frequency domain representation of a DC bias sensing indicated by reference numeral 30, shows a DC bias magnetic field 32, a DC bias magnetic field generated "signal of interest" 34 occurring at and near DC as a result of using the DC bias magnetic field, and one or more magnetic fields associated with magnetic interferences, indicated collectively by reference numeral 36, also occurring near DC. Now turning to FIG. 2B, the frequency domain representation of the AC bias sensing, indicated by reference numeral 40, shows an AC bias magnetic field 42 at a carrier frequency $f_c$, a modulated signal portion (corresponding to the information of interest) 44 occurring at a frequency band centered at the carrier frequency as a result of using an AC bias magnetic field for modulation. The location of the magnetic interferences 36 from FIG. 2A, shown again in FIG. 2B, is unchanged. Thus, it can be seen from FIGS. 2A and 2B that using an AC bias magnetic field instead of a DC bias magnetic field results in the spectrum of the modulated signal portion being separated from the spectrum of the magnetic interference. As discussed above, the selection of carrier frequency is significant. A careful selection of the carrier frequency based on an understanding of frequencies of known or potential sources of magnetic interference will enable that portion of magnetic field signal (produced by the transducer) corresponding to the information of interest to be shifted from DC into a lower perturbation or perturbation-free frequency band, as illustrated in FIG. 2B.

Figure 3:
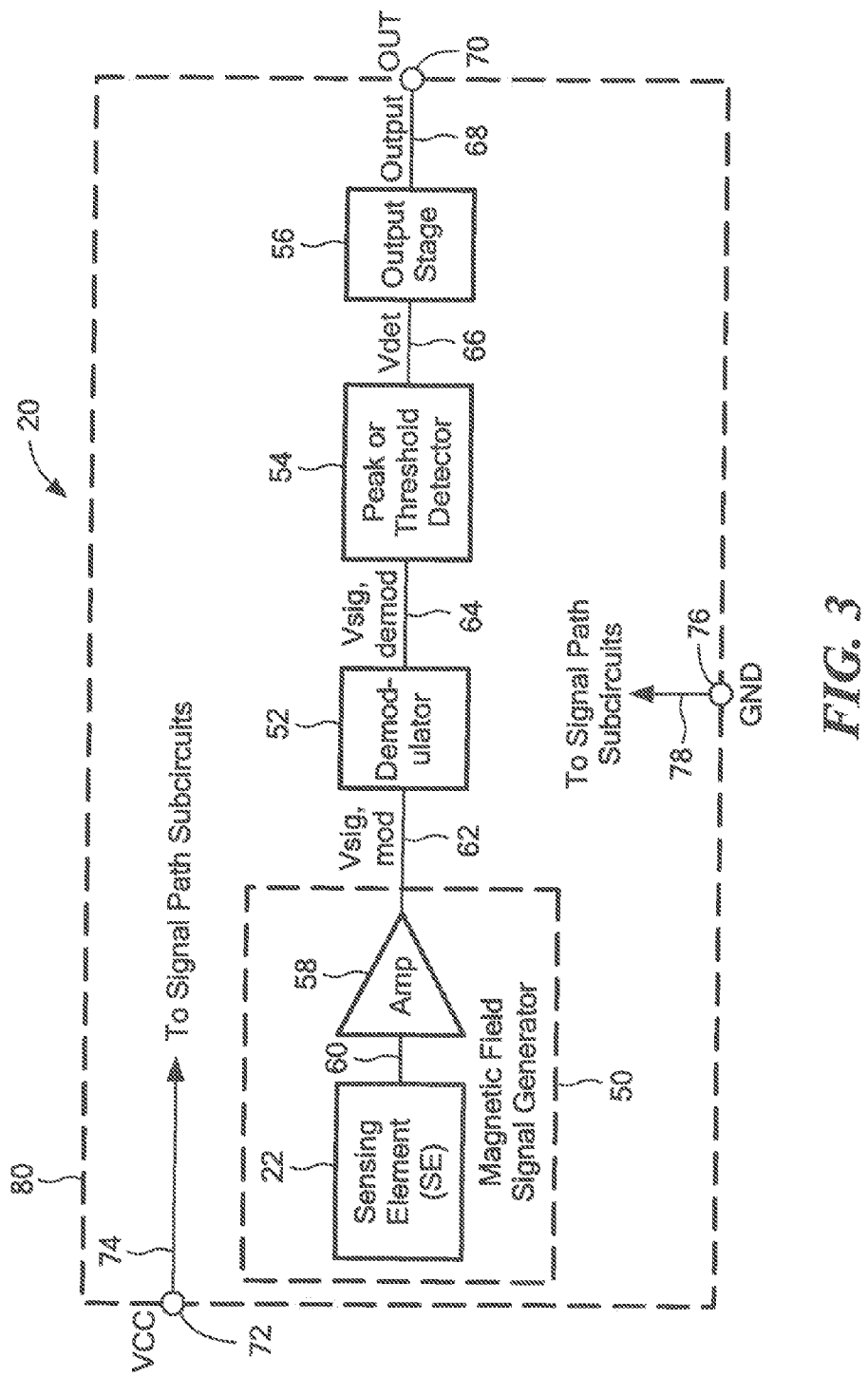
FIG. 3 shows a functional block diagram of an exemplary magnetic field sensor having a sensing element to sense a modulated AC bias magnetic field and a demodulator.

Referring to FIG. 3, a functional block diagram of an example embodiment of the magnetic field sensor 20 (from FIG. 1) for ferromagnetic target detection is shown. The magnetic field sensor 20 includes a magnetic field signal generator 50, a demodulator (or demodulation unit or circuit) 52, a threshold and/or peak-referenced (or peak) detector 54 and an output stage 56. The magnetic field signal generator 50 includes the at least one sensing element 22, coupled to an amplifier 58 by a sensing element output 60. The amplifier 58 generates at its output a magnetic field signal 62. The magnetic field signal 62 includes a first signal portion (also referred to herein as a modulated signal portion) based on the modulated AC bias magnetic field, but may contain contributions from low frequency magnetic interference as well. These contributions are referred to herein as a second signal portion (or unwanted signal portion) of the magnetic field signal 62. The magnetic field signal 62 is shown generally as "Vsig, mod" 62. The output of the amplifier 58 is provided as an input to the demodulator 52, which produces a demodulated version of the magnetic field signal ("Vsig, demod") at a demodulator output 64. The demodulated magnetic field signal 64 (also referred to herein as the signal of interest) is provided as an input to the detector 54, which generates a detector output signal shown as a "Vdet" signal 66. The detector output signal 66 is provided as an input to the output stage 56, which provides a sensor output signal 68 at a sensor output "OUT" 70.

In an application, when the magnetic field sensor 20 is positioned in proximity to a target, for example, a rotating ferromagnetic toothed gear, the sensor output signal 68 is indicative of the speed of rotation. It will be understood that the demodulator output 64 can be provided as an analog output signal, either at OUT 70 instead of signal 68 or at an additional output. One or both of these output signals are made available to a user or application for further processing (e.g., speed, direction and/or position determination). Thus, the magnetic field sensor 20 is capable of providing information that is representative of the movement of the target relative to the sensor. That information may be provided as a digital output signal, an analog output signal or both.

An external power supply voltage can be provided to the magnetic field sensor 20 at a VCC terminal or input 72. The sensor's subcircuits are coupled to the VCC input 72 via a VCC bus 74 and are connected to a ground (GND) terminal 76 through an internal GND connection 78.

Although the magnetic field signal generator 50 is illustrated as having only a single sensing element, e.g., SE 22, a sensing configuration with more than one sensing element, e.g., a differential sensing configuration, could be used. The magnetic field sensor functionality shown in FIG. 3 may be provided in the form of an integrated circuit (IC). The I/O interface of such an IC is indicated in the figure by dashed lines 80. The packaged IC would have at least one pin or lead to correspond to each of the VCC input or terminal 72, GND terminal 76 and the output (OUT) 70. The magnetic field sensor or sensor IC 20 can be provided with other features and signals not shown. It will be appreciated that the functionality of the IC, that is, the circuit elements contained within it, can be varied to suit a particular application.

The output stage 56 may be implemented as a totem-pole push-pull or open drain, open collector output configuration. This type of configuration is a typical configuration. Devices with such an output are sometimes referred to as "three-wire" devices. A three-wire device is shown in FIG. 3. Alternatively, the output stage could be implemented as a current source output structure that provides two or more levels of current representing two digital output states of the sensor. The output current could be provided on the supply/ground lines. The use of a current source output structure would eliminate the need for the output 70. Sensor devices with the current output structure are sometimes referred to as "two-wire" devices. In other implementations, the output can be coded in a protocol like Inter-Integrated Circuit (I²C), Serial Peripheral Interface (SPI), Single Edge Nibble Transmission (SENT) or other protocols used in automotive, industrial or consumer applications.

Other aspects of the magnetic field sensor, not shown, may be implemented according to known techniques and designs. It will be understood that the device may contain various other circuits that operate collectively to generate the sensor output from the magnetic field signals of the sensing element(s). For example, other circuitry may be incorporated in the device to implement such features as dynamic offset cancellation (i.e., chopper stabilization), automatic gain control (AGC) and offset adjustment, to name but a few.

The detector 54 may be implemented to perform as a peak detector, a threshold detector or may perform both types of detection. Peak detectors track their input signal, in this instance, the demodulated magnetic field signal 64, and switch at a threshold level related to peaks of the input signal. Threshold detectors apply levels with which that input signal is compared to induce switching. These thresholds may be relative thresholds defined as a percentage of peak-to-peak amplitude (for example, 85% and 15%, or 60% and 40%) or can be a fixed threshold (e.g., a zero crossing threshold).

As noted above, although the illustrative sensing arrangement of FIG. 1 is shown in connection with a rotating target having mechanical profile features, such as a toothed gear wheel, it will be understood that the circuits and techniques of the sensor architecture described herein may be applied to sensing of other types of targets as well. For example, the target could be implemented to include an object made of a hard ferromagnetic material (that is, a permanent magnet) such as a ring magnet or other type of multi-pole magnet. Such a target could have a profile with a pattern of magnetic 'features' defined by a sequence of alternating north and south magnetic poles, instead of a pattern of mechanical features such as teeth and valleys, as described above.

Figure 4:
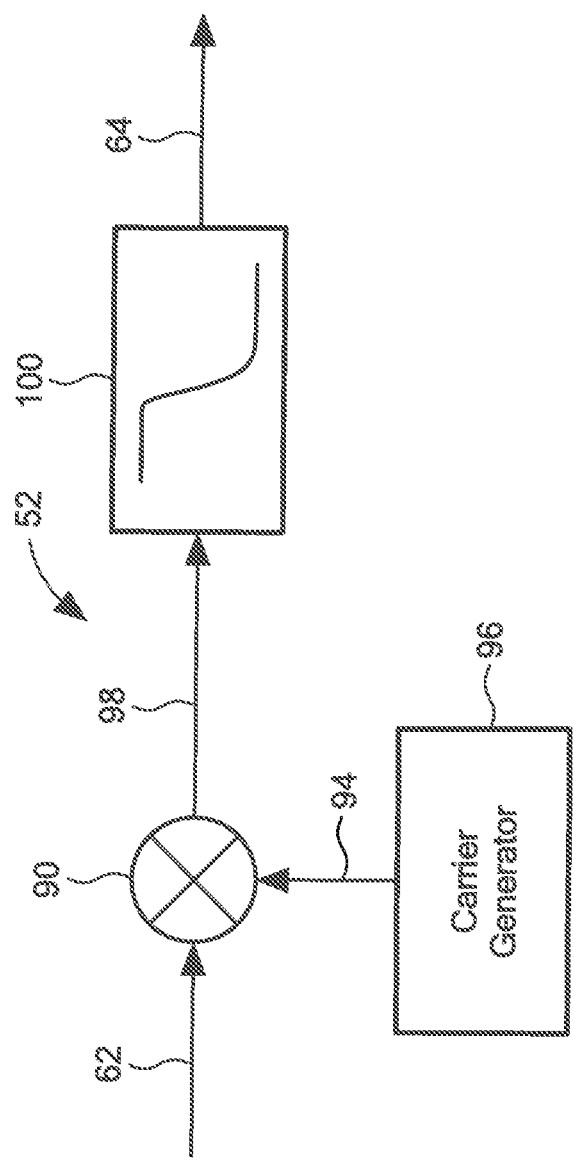
FIG. 4 shows a block diagram of an exemplary embodiment of the demodulator from FIG. 3.

The demodulator 52 (of FIG. 3) can be implemented as a product detector or according to other known techniques (e.g., using envelope detection). In one embodiment, as shown in FIG. 4, a product detector implementation of the demodulator 52 includes a frequency mixer (or multiplier) 90, which receives as inputs the magnetic field signal 62 and a carrier generator signal 94 from a carrier generator 96. The mixer 90 takes the product of the magnetic field signal 62 and the locally derived carrier signal (e.g., local oscillator generated signal) 94 to produce an output 98 that includes the information of interest of the first signal portion at and near DC and a higher frequency component corresponding to any magnetic inferences that were present near DC when the sensing measurement was taken. The product detector thus changes the locations of the first signal portion and the second (unwanted) signal portion in the frequency spectrum by shifting the first signal portion of the magnetic field signal 62 from its current frequency band (the first frequency band) to a lower frequency range that includes DC (the third frequency band) and shifting the second signal portion to the first frequency band from a second, lower frequency band (the second frequency band). As mentioned earlier, the first frequency band is based on the carrier frequency, selected so that the spectrum of the first portion of the magnetic field signal is separated from the frequency spectrum of the second portion of the magnetic field signal. The frequency of the local oscillator is the same as (and in phase with) that of the carrier used for modulation, i.e., the AC signal applied to the AC bias coil.

Still referring to FIG. 4, the demodulator 52 also includes a low pass filter (LPF) 100. The signal 98 provided as input to the LPF 100 is low-pass filtered to generate signal 64. The low-pass filtering preserves the information of interest of the first signal portion while removing the second signal portion. Thus, the "demodulated" magnetic field signal 64, which contains the information of interest concerning the target, can at this stage be provided as an analog sensor output or can be further processed by detector 54 (FIG. 3) to produce a digital signal representation of the target profile movement.

FIGS. 5A-5B illustrate the demodulation process. With reference to FIG. 5A, a frequency domain representation of demodulation as seen at the mixer output, indicated by reference numeral 110, shows the first signal portion at the third frequency band, which includes DC and near DC values (indicated by reference numeral 112) and the second signal portion corresponding to the magnetic interferences at the higher first frequency band of the carrier frequency (as indicated by reference numeral 114). With reference to FIG. 5B, a frequency domain representation of demodulation after low pass filtering, indicated by reference numeral 120, shows only the first signal portion at and near DC 112 (the higher frequency component indicated by reference numeral 114 in FIG. 5A having been removed by the filtering).

As mentioned earlier, the AC carrier signal can be generated by the magnetic field sensor or may be provided by external components. Also, the AC bias coil may be packaged with the magnetic field sensor in a variety of different ways. For example, the coil may be formed as part of the sensor die (as illustrated in FIG. 7). Examples of various suitable coil input signal generation and coil packaging options will be described with reference to FIGS. 6A-6C and FIGS. 7-12 below.

Figure 6A:
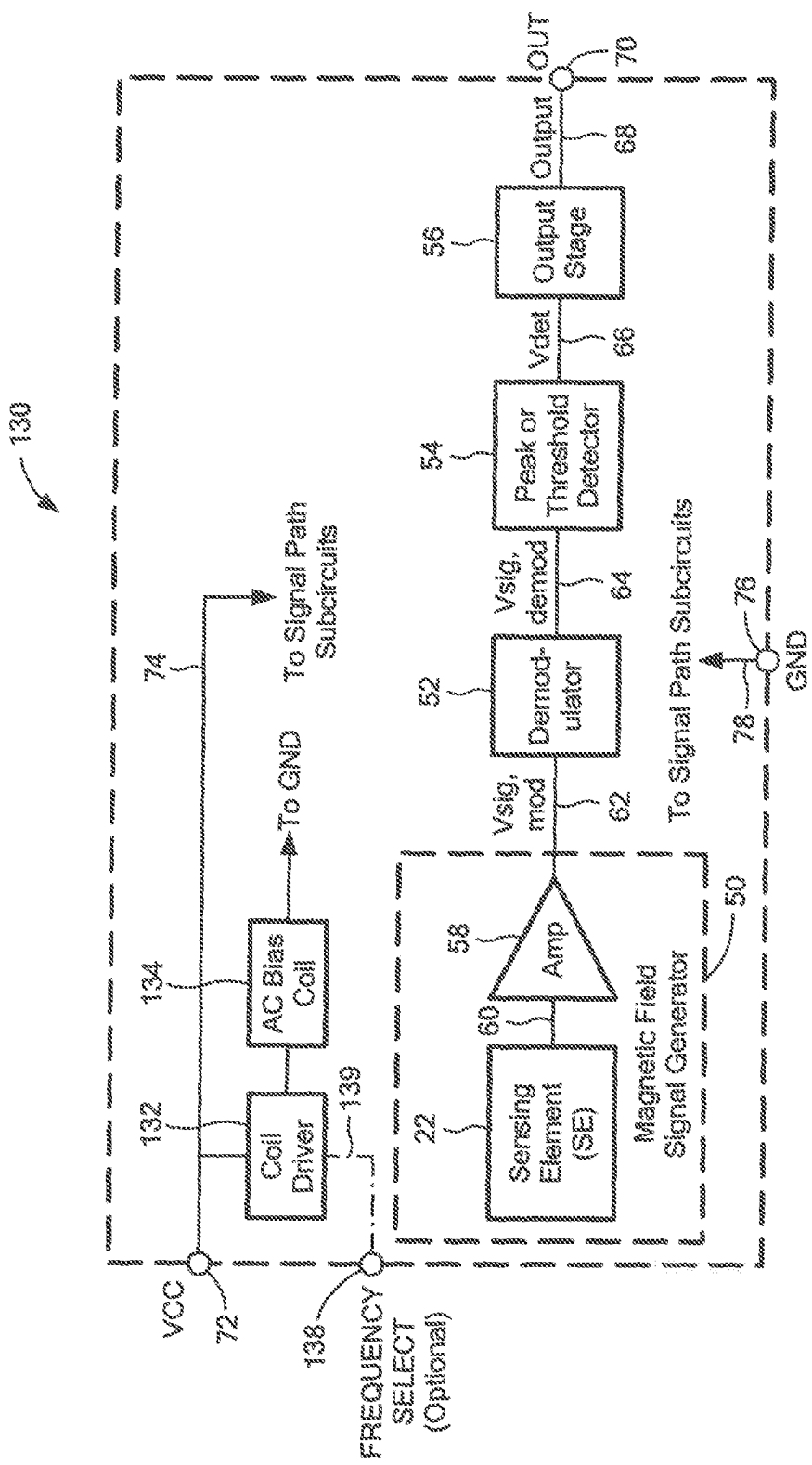
FIGS. 6A-6C show functional block diagrams of exemplary magnetic field sensors that include a coil driver and an AC bias coil (FIGS. 6A-6B) and a flow diagram of an exemplary process for setting/adjusting frequency (FIG. 6C)
Figure 6B:
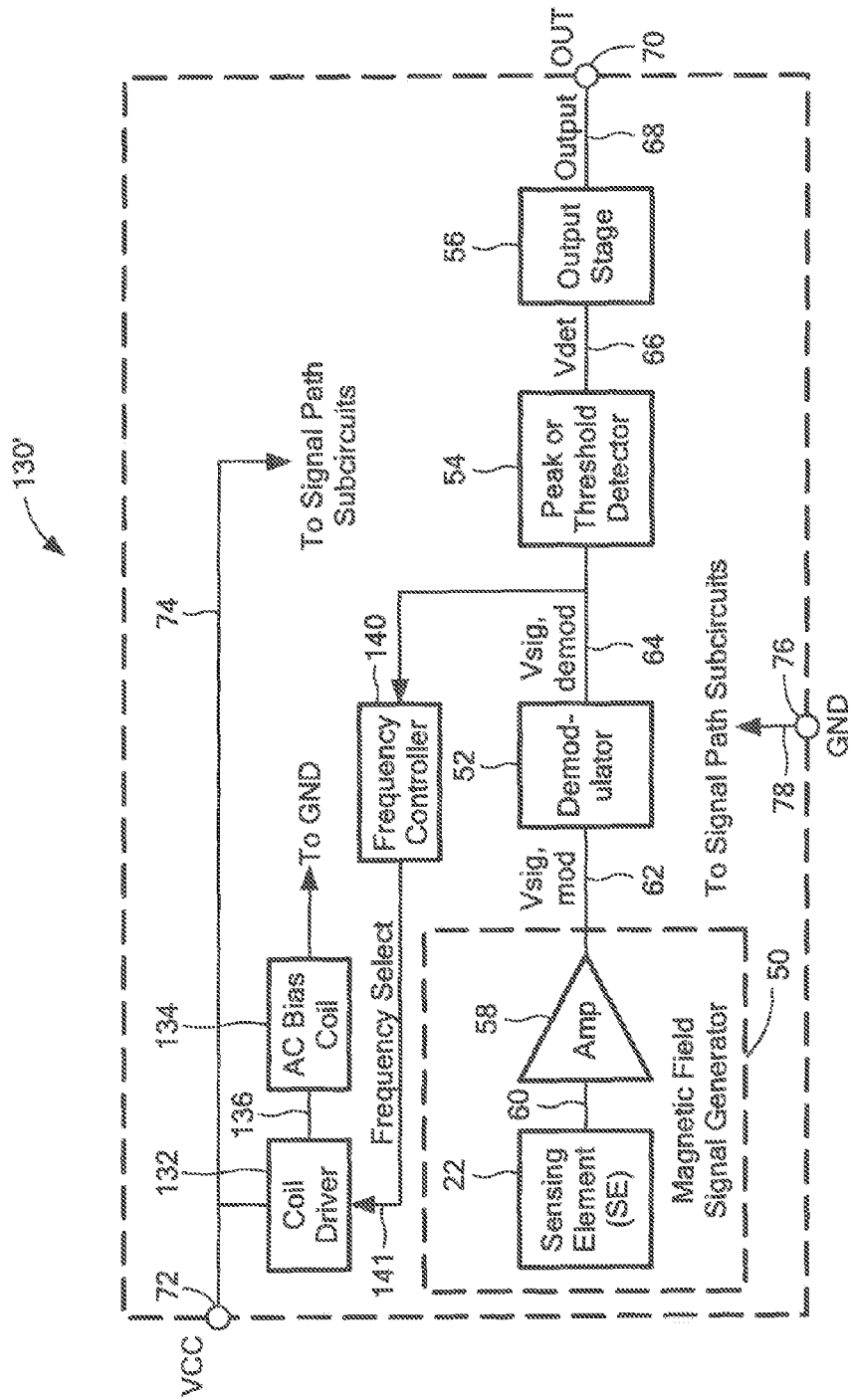
Figure 7:
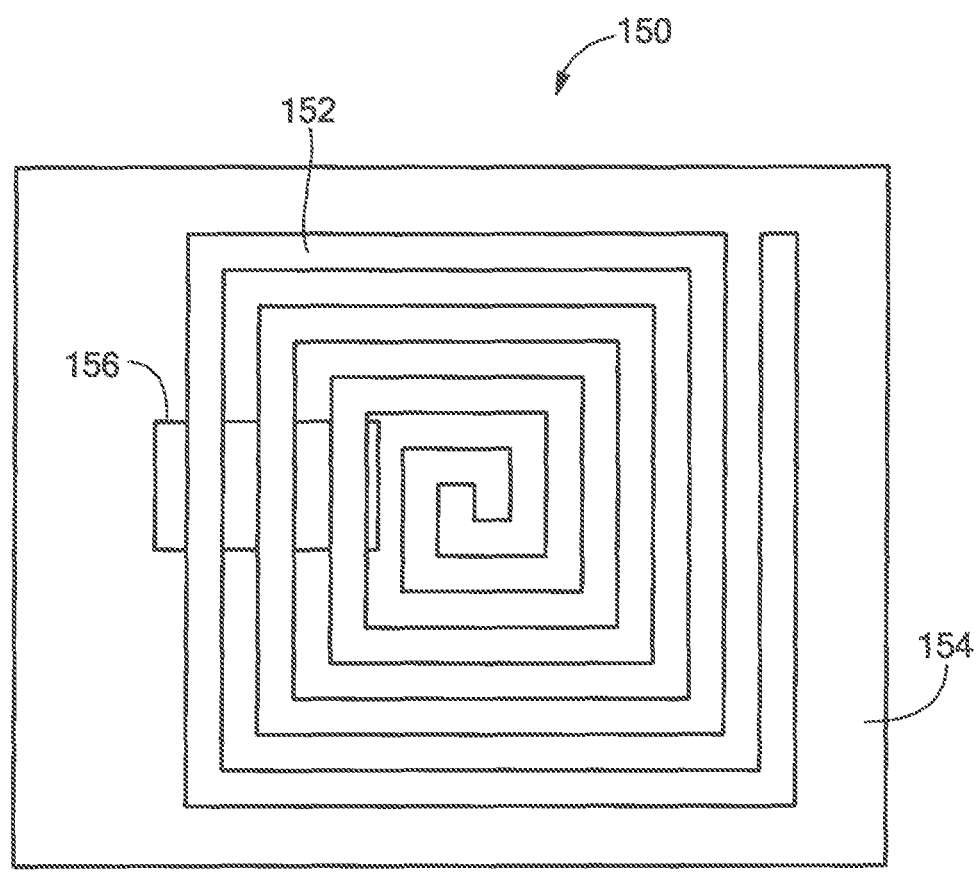
FIG. 7 shows a plan (top) view of an exemplary magnetic field sensor with an integrated. AC bias coil.

FIGS. 6A-6B show functional block diagrams of alternative embodiments of the magnetic field sensor. In one alternative embodiment, and referring to FIG. 6A, the magnetic field sensor, shown here as magnetic field sensor 130, includes an AC bias coil driver circuit 132 and an AC bias coil 134. Other features of the sensor are the same as shown in FIG. 3. The coil driver 132 is coupled to the voltage supply bus 74 to receive a DC supply signal from the DC supply input 72 over bus 74. The coil driver 132 is connected to and provides an AC signal 136 to the AC bias coil 134. The AC signal 136 is used to set and control the AC carrier frequency of the AC bias coil 134. The coil driver 132 may be implemented with an oscillator circuit or signal generator.

As was noted earlier, the AC carrier frequency may be a fixed frequency or a variable (or adjustable) frequency. As shown in FIG. 6A, the coil driver 132 can be implemented with an input (shown as optional "FREQUENCY SELECT" input 138) to enable the sensor user or application to set an initial value of AC carrier frequency as well as change the AC carrier frequency, via an optional input line 139 connecting input 138 to the coil driver 132, during operation. For example, the value of one or more internal components of coil driver 132 can be adjustable under external user or application control (via the input 138) so as to alter the frequency of the AC carrier produced at the output of the driver circuit 132.

In addition to the coil driver and bias coil, the sensor may be provided with other features. In another possible alternative embodiment, shown in FIG. 6B, the sensor (shown here as sensor 130') further includes a frequency controller 140 that is configured to automatically set and/or adjust (or vary) the AC carrier frequency. The frequency controller 140 generates an output, shown as a frequency select signal 141, and provides the frequency select signal 141 to the coil driver 132. The coil driver 132 adjusts the frequency of the AC signal 136 (and therefore the AC carrier frequency of the AC bias coil 134) based on the frequency select signal 141. The AC carrier frequency may be adjusted over time, for example, based on a time interval and/or other criteria or information, such as an evaluation of the sensor's responses for different AC carrier frequencies.

In the illustrated embodiment, the frequency controller 140 receives sensor response feedback and can use that feedback to modify the manner in which it generates signal 141. More specifically, frequency controller 140 receives as an input the magnetic field signal after demodulation, for example, Vsig, demod 64 (as shown) or the post-demodulation magnetic field signal available at a later point in signal processing, for example, the output signal 68. As mentioned earlier, the carrier frequency may be varied over time to prevent the carrier from coinciding with any fixed frequency interference. Other features of sensor 130' are the same as in FIG. 6A.

Figure 6C:
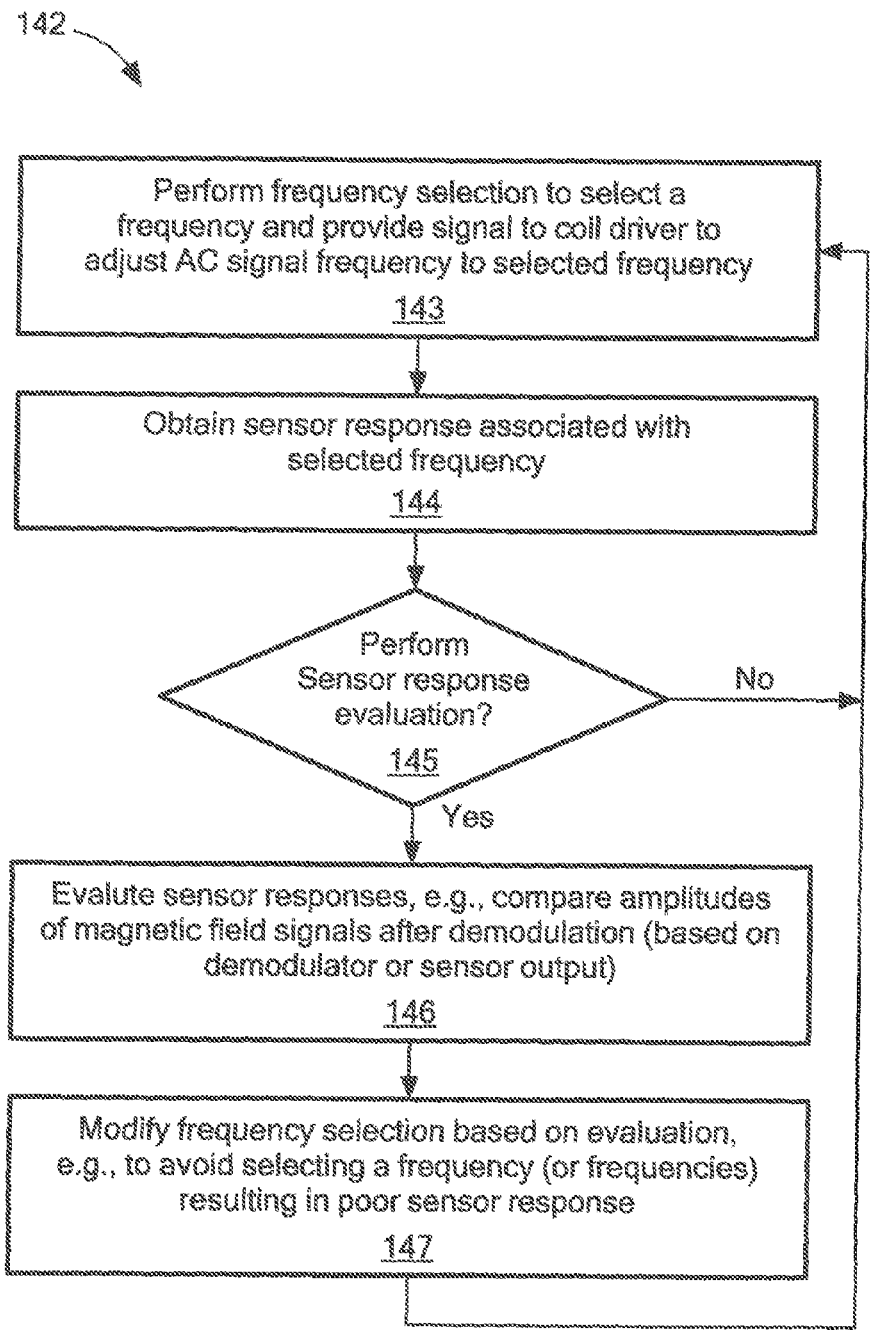

Referring now to FIG. 6C in conjunction with FIG. 6B, an exemplary process 142 for frequency control by the frequency controller 140 is as follows. The frequency controller 140 performs a frequency selection to select a frequency and provides a signal (signal 141, in FIG. 6B) to the coil driver 132 to cause the coil driver 132 to adjust the frequency of the AC signal being provided to the AC bias coil 134, that is, the AC carrier frequency, to the selected frequency (block 143). The "frequency selection" performed by the frequency controller 140 may be a process for selecting frequency, based on fixed or adjustable parameters or criteria. The frequency controller 140 obtains a sensor response associated with the selected frequency (block 144), e.g., by receiving the output of the demodulator (output 64) or a signal provided a different point in the signal path, e.g., sensor output 68. The frequency controller 140 determines if a sensor response evaluation should be performed (at block 145). The frequency controller 140 may be configured to make this determination based on whether a certain number of carrier frequency changes have been made or time interval has elapsed (or based on other criteria). If the outcome indicates that an evaluation should not be made at this point, the frequency controller 140 returns to block 143 to continue making frequency selections and collecting associated responses based on those selections. If the frequency controller 140 instead determines (at block 145) that an evaluation should be performed, the frequency controller 140 evaluates sensor responses obtained up to this point (block 146), e.g., by comparing the responses for the different carrier frequencies. The frequency controller 140 then modifies the frequency selection based on the comparison (block 147) and returns to block 143. For example, if a carrier frequency results in a different signal amplitude or frequency as compared to other carrier frequencies then that carrier frequency could be presumed to contain interference, in which case the frequency selection could be modified to avoid selecting that frequency.

Another approach to frequency adjustment would be to vary the carrier frequency rapidly enough that any error introduced at a particular troublesome carrier frequency would be filtered out. Other processes to set as well as adjust the AC carrier frequency may be used as well.

It will be understood that a process such as process 142 could be performed by the end user or application, which could provide an input to the coil driver via input 138 and obtain sensor response, output 68, via the sensor output pin, OUT 70.

Although not shown, the sensor 130' of FIG. 6B may be provided with a frequency select input (like FREQUENCY SELECT 138 from FIG. 6A) so that the sensor can perform frequency control (via frequency controller 140) and also respond to external frequency control (e.g., to override, reset or otherwise modify the frequency set internally by controller 140). The frequency select input, if provided, could be coupled to controller 140 instead of coil driver 132.

Still referring to FIGS. 6B-6C, the frequency controller 140 can be implemented in hardware or a combination of hardware and software. For example, the frequency controller 140 may be a processor or controller programmed to perform the functions illustrated in the process 142 (or other process).

FIG. 7 shows a top view of a layout for an exemplary magnetic field sensor 150 having an AC bias coil 152 and a die 154 containing a sensing element 156. This configuration is referred to herein as an "on-chip" coil configuration, to distinguish it from other configurations in which the coil is part of the sensor (for example, configurations such as those shown in FIGS. 8-12). The sensing element 156 is located proximate the AC bias coil 152. For simplicity, other circuitry of the magnetic field sensor (for example, circuitry to implement features shown in the block diagrams of the example embodiments of FIGS. 6A-6B) are omitted.

In the illustrated embodiment of FIG. 7, the position of the sensing element 156 is aligned with one 'side' of the coil 152. That is, the sensing element 156 is aligned with a portion of the coil 152 in which current is flowing in the same direction with respect to one side of the die. Other arrangements of coil relative to sensing element position are possible. For example, the sensing element can be generally centered in the coil. Also, and again referring to the example embodiment shown in FIG. 7, the coil 152 is shown as being disposed above the sensing element 156. It will be understood, however, that the coil 152 could instead be disposed beneath the sensing element 156. With the latter arrangement, the coil can be fabricated with a standard IC process and then integrated with the sensing element 156 in a separate process. The embodiment shown would be advantageous for a sensor sensitive in the plane of the die such as a vertical Hall element or a GMR, AMR, spin-valve, or TMR element.

Insulation layers are placed between the coil and sensor material and/or die substrate as required by sensor and substrate material selection so as not to short circuit the materials and coil.

The particular size and geometry of the coil can vary to meet the needs of a particular application. The coil can be formed so that the turns have any practical shape, such as a square or rectangle (as illustrated in the top view of FIG. 7), or other shapes such as circle, oval, etc., or multiple layers.

In exemplary "on-chip" coil embodiments, the coil is formed using conventional deposition and or etching processes, or patterning and electroplating processes well known to one of ordinary skill in the art. In general, spacing from the coil to the sensing element can vary, in part as a result of voltage isolation requirements. It is also understood that insulation layers may be placed between the coils and the sensors and/or other die material to prevent shorting of the coil to other electrical layers in the device.

The coil is shown as having a planar spiral (or "pancake") type of geometry. The vias and connections are omitted in the figure (for clarity) but would be apparent to one of ordinary skill in the art. It is understood that multiple metal layers can be used as well as other geometries of metal. Other coil geometries including but not limited to meander coils and solenoids may be used. For example, a cylindrical coil having coil turns of substantially uniform diameter (i.e., a solenoid type coil) may be used. The coil arrangement can include a magnetic flux concentrator, which can be made of a soft magnetic material, to improve the magnetic flux generated by the coil. For example, a soft ferromagnetic core may be provided inside a solenoid type coil to concentrate the magnetic field generated by the coil.

In a cylindrical coil the direction of the magnetic field lines will be parallel to the length of the coil (that is, the longitudinal path of the coil). In a planar spiral coil design the direction of the field lines at the center of the coil will be substantially perpendicular to the plane of the coil but will be substantially parallel to the die surface under the turns of the coil. Consideration may be given to the direction of the field generated by the coil at various locations in choosing the appropriate position and type of the sensing element.

It will be appreciated that the size of an "on-chip" coil as depicted in FIG. 7 is likely to be much smaller than coils located elsewhere in a sensor, sensor assembly or application. Because magnetic fields generated by the relatively smaller "on-chip" coils may not be particularly strong, high sensitivity elements such as GMR may be more suitable for an on-chip design like the one shown in FIG. 7 than less sensitive sensing types of elements such as Hall.

Additional details or alternative techniques for providing a conductive coil on a sensor die may be had with reference to U.S. patent application Ser. No. 13/468,478, filed May 10, 2012 and entitled "Methods and Apparatus for Magnetic Sensor Having Integrated Coil," as well as U.S. Patent Publication No. 2010/00211347, U.S. Pat. No. 8,030,918, and U.S. Pat. No. 8,063,634, each of which is assigned to the Assignee of the subject application and incorporated herein by reference in its entirety.

Figure 8:
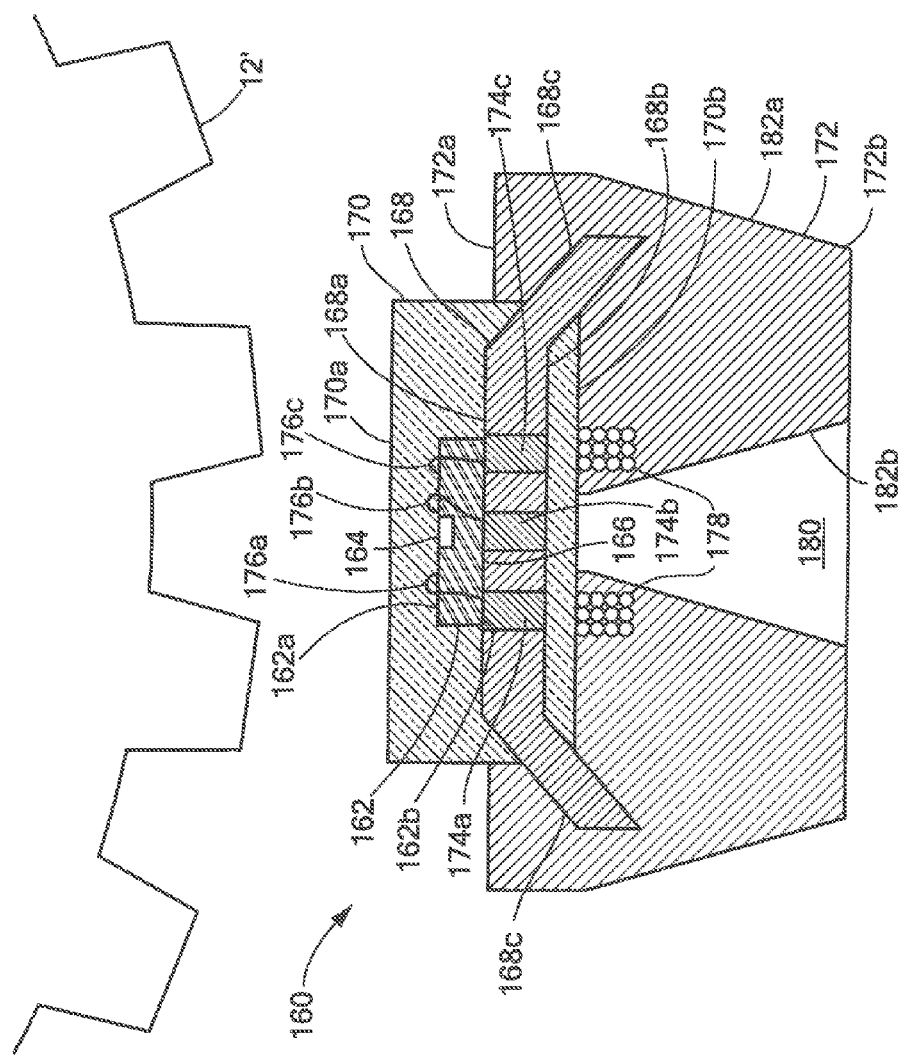
FIG. 8 is a cross-sectional view of a magnetic field sensor having a first, non-conductive mold portion, an AC bias coil, and a second mold portion.
Figure 9:
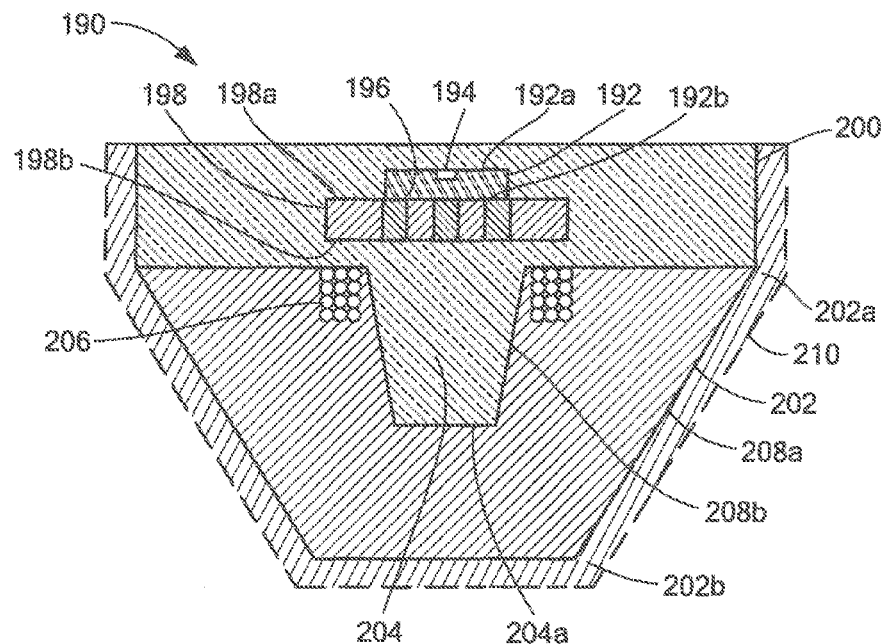
FIG. 9 is a cross-sectional view of an alternative magnetic field sensor having a first, non-conductive mold portion, an AC bias coil, and a second mold portion.
Figure 10:
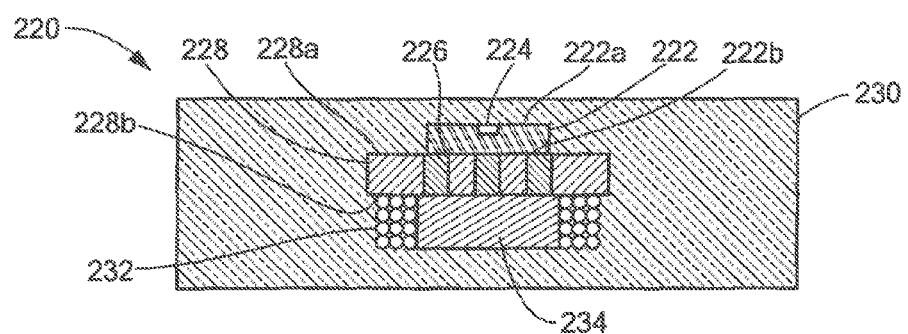
FIG. 10 is a cross-sectional view of another alternative magnetic field sensor having a non-conductive mold material and an AC bias coil.

Examples of other suitable configuration and packaging options for the sensing arrangement of a magnetic field sensor with an AC bias coil (shown conceptually in FIG. 1) are illustrated in FIGS. 8-10. These and other configurations can accommodate a larger coil capable of producing a larger magnetic field. Exemplary construction details are shown in the cross-sectional side views of FIGS. 8-10. FIGS. 8-9 illustrate arrangements that utilize two mold portions, one to encase the sensor die (and at least a portion of the sensor lead frame) and the other to encase the AC bias coil. FIG. 10 illustrates the sensor/coil arrangement as a unitary design in which the coil, sensor die and lead frame are encased in the same, non-conductive mold material.

Referring to the cross-sectional view of FIG. 8, a magnetic field sensor 160 includes a semiconductor die 162 having a first, active surface 162a in which a magnetic field sensing element or transducer 164 is formed and a second, opposing surface 162b attached to a die attach area 166 on a first surface 168a of a lead frame 168, a first mold portion comprising a nonconductive mold material 170 enclosing the die and at least a portion of the lead frame, and a second mold portion 172 secured to the non-conductive mold material. The second mold portion 172, which can be a non-conductive material or a ferromagnetic material, is shown as but not required to be tapered from a first end 172a proximate to the lead frame 168 to a second end 172b distal from the lead frame.

The magnetic field sensing element 164 in this and other embodiments can be, but is not limited to the types of sensing elements and configurations described earlier. In some embodiments, it may be desirable to use two or more substrates, one for the magnetic field sensing element(s) and another, such as a Si substrate, for associated processing circuitry. Illustrative multiple substrate arrangements are described in U.S. Pat. No. 7,768,083 entitled "Arrangements for an Integrated Sensor," which is assigned to the Assignee of the subject application.

It will be appreciated by those of ordinary skill in the art that while the active surface 162a of the semiconductor die 162 is described herein as the surface "in" which the magnetic field sensing element is disposed or formed as is the case with certain types of magnetic field elements (e.g., Hall plate), the element may be disposed "over" or "on" the active semiconductor surface (e.g., magnetoresistance elements). For simplicity of explanation however, while the embodiments described herein may utilize any suitable type of magnetic field sensing elements, such elements will be described generally herein as being formed or disposed "in" the active semiconductor surface.

In use, the magnetic field sensor 160 like the other sensor embodiments described herein may be positioned in proximity to a moveable ferromagnetic target, such as the illustrated gear 12', such that the magnetic field transducer 164 is adjacent to the article 12' and is thereby exposed to a magnetic field altered by movement of the article. The magnetic field transducer 164 generates a magnetic field signal proportional to the magnetic field.

The magnetic field sensor 160 generally includes additional circuitry formed in the active surface 162a of the die 162 for processing the magnetic field signal provided by the transducer 164. The lead frame 168 includes leads 174a-174c for coupling the circuitry to system components (not shown), such as a power source or microcontroller. Electrical connection between the leads 174a-174c and the semiconductor die 162 can be provided with wire bonds 176a-176c, respectively as shown. While the sensor 160 is shown to include three leads 174a-174c, it will be appreciated by those of ordinary skill in the art that various numbers of leads are possible. Other techniques for electrically coupling the lead frame leads to the sensor components include solder bumps or balls, or pillar bumps. The sensor 160 may be provided in the form of a two to six pin Single In-Line (SIP) package, or some other number of pins as appropriate.

The first mold portion 170 is comprised of a non-conductive material so as to electrically isolate and mechanically protect the die 162 and the enclosed portion of the lead frame 168. Suitable materials for the non-conductive mold material 170 include thermoset and thermoplastic mold compounds and other commercially available IC mold compounds. It will be appreciated that the non-conductive mold material 170 can contain a ferromagnetic material, such as in the form of ferromagnetic particles, as long as such material is non-conductive.

The non-conductive mold material of the mold portion 170 is applied to the lead frame/die subassembly during a molding process to enclose the die 162 and a portion of the lead frame 168. The non-conductive mold portion 170 has a first surface 170a and a second, opposing surface 170b. The shape and dimensions of the non-conductive mold portion are selected to suit a particular IC package.

In some embodiments, the second mold portion 172 is comprised of a soft ferromagnetic material to form a concentrator. As will be apparent to those of ordinary skill in the art, various materials are suitable for providing the ferromagnetic mold material 172 in the form of a soft ferromagnetic material. In some embodiments, it may be desirable for the soft ferromagnetic mold material to have a relatively low coercivity and high permeability. Suitable soft ferromagnetic materials include, but are not limited to permalloy, NiCo alloys, NiFe alloys, steel, nickel, and soft magnetic ferrites.

The second mold portion 172 can be secured to the first mold portion 170 during a step or steps of a molding process, or using an adhesive, such as a thermoset adhesive (e.g., a two part epoxy).

In some embodiments, a portion of the first mold portion 170 that contacts the second mold portion 172 and/or the portion of its mold material that contacts the non-conductive mold material has a securing mechanism in order to improve the adhesion between the two materials and to prevent or reduce lateral slippage or shear between the materials. As one example, the lead frame 168 has extensions 168c (or "barbs") which extend beyond the non-conductive mold material and are enclosed by the mold material of the second mold portion 172, as shown. Such lead frame extensions additionally enhance the adhesion of the second mold portion/material to the lead frame itself. In such embodiments utilizing lead frame portions as a securing mechanism such that the mold material of the second mold portion 172 contacts such lead frame portions, it will be appreciated that the second mold portion 172 should be non-conductive or have a sufficiently low conductivity to prevent the leads from electrically shorting resulting in the device not operating as intended. Alternative forms of securing mechanisms can be used.

Still referring to FIG. 8, the sensor 160 also includes an AC bias coil, indicated in this figure by reference numeral 178. The illustrative AC bias coil 178 is positioned relative to the magnetic field sensing element 164 to provide a back bias AC bias magnetic field, which can be used to detect the target's profile as it passes the sensor. To this end, the coil 178 is positioned adjacent to the second surface 170b of the non-conductive mold material 170 so that the transducer 164 is closer to the target 12' than the coil 178, as shown. It will be appreciated that it may be desirable in certain applications to rotate the sensor 160 by 180° so that the coil 178 is closer to the target than the transducer or to rotate the sensor by 90° so that the major face of the transducer is orthogonal to the target, thereby achieving a different type of magnetically sensitive sensor, as may be desirable when the transducer is a magnetoresistance element, for example, which has a different axis of sensing element sensitivity than a planar Hall element. It may also be desirable in an embodiment to rotate coil 178 such that its central axis is parallel to the surface of the die 162 for certain sensor configurations and sensing element combinations.

Various techniques and materials can be used to form the AC bias coil 178. For example, the coil can be formed from copper wire of various sizes and with various automated processes so as to provide an insulator between coil windings. The coil material selection, wire gauge selection, number of turns, and other design choices can be readily varied to suit a particular application so as to produce a magnetic field of a desired strength. The coil 178 may be formed so that each turn is in the shape of a circle, rectangle, or other shapes such as an oval, as desirable to suit a particular application and packaging arrangement.

The AC bias coil 178 may be secured to the second surface 170b of the non-conductive mold material 170 by various means. As one example, an adhesive, such as an epoxy, may be used to secure the coil in place. Once secured in place, the mold material 172 may be formed by a suitable molding process, such as by injection molding for example.

A mold cavity used to define the second mold portion 172 may include a mandrel so that the second mold portion forms a ring-shaped structure having a central aperture 180, here extending from the second surface 170b of the non-conductive mold material to a second end 172b of the second mold portion. The mold material 172 may form a conventional O-shaped ring structure or a D-shaped structure. Alternatively, the mold material 172 may form only a partial ring-like structure, as may be described as a "C" or "U" shaped structure. More generally, the mold material 172 comprises a non-contiguous central region such that the central region is not formed integrally with its outer region.

Such central region may be an open area, such as in the case of aperture 180 in FIG. 8, or may contain a mold material, for example, a ferromagnetic mold material. A third mold material may be formed by an additional molding step or other suitable fabrication technique so as to secure that third mold material to the second mold portion 172. The third mold material may be comprised of a hard ferromagnetic material, a soft ferromagnetic material, or a non-ferromagnetic mold compound.

The second mold portion 172 is tapered from its first end 172a (or a location close to its first end) to its second end 172b as is apparent from the side view of FIG. 8. In particular, the second mold portion has a first taper to its outer circumferential surface 182a and a second taper to its inner central aperture surface 182l. The purpose of the taper is to facilitate removal of the sensor 160 from the mold cavity. The angle of the taper of the surfaces 182a, 182b may be the same or similar to each other and generally, the angle of the taper of the surfaces 182a, 182b is less than approximately 15 to 20 degrees. In some embodiments, the angle of taper is on the order of 2-7 degrees. In some embodiments the taper 182b may have more than a single slope.

The sensor can also be arranged in a lead on chip configuration with the lead frame positioned above the die. An adhesive may be used to secure the lead frame to the active surface of the die.

Referring to FIG. 9, an alternative magnetic field sensor 190 includes a semiconductor die 192 having a first active surface 192a in which a magnetic field sensing element 194 is disposed and a second, opposing surface 192b attached to a die attach area 196 on a first surface 198a of a lead frame 198, a first mold portion or non-conductive mold material 200 enclosing the die and at least a portion of the lead frame, and a second mold portion or mold material 202 secured to a portion of the non-conductive mold material. A securing mechanism, or other suitable mechanisms, may be provided to enhance the adhesion between the first and second mold materials.

The non-conductive mold material 200 has a protrusion 204 extending away from a second surface 198b of the lead frame 198 as shown. The protrusion 204 prevents there being a void in the bottom surface of the sensor 190 (adjacent to the second end 202b of the mold material), since the presence of a void may make overmolding more difficult. It will be appreciated by those of ordinary skill in the art that the protrusion may extend all or only part of the way to the second end 202b of the second mold material 202. In the illustrated embodiment of FIG. 9, the protrusion 204 terminates before the second end 202b of the second mold material 202. Thus, the distal end 204a of the protrusion 204 is covered with the second mold material 202, as shown.

The sensor 190 includes an AC bias coil 206 that may the same as or similar to the coil 178 of FIG. 8. Here, the AC bias coil 206 is positioned concentrically with respect to the protrusion 204 of the non-conductive mold material 200, although it will be appreciated that concentric positioning is not required. It will be appreciated that the taper to the protrusion 204 may be eliminated or altered as suitable for a particular application. In some applications the protrusion may be useful as an aligning feature for the AC bias coil during assembly or manufacturing. Here again, the AC bias coil 206 may be secured to the mold material 200 by an adhesive. Alternatively however, the AC bias coil 206 may be sized and shaped to provide an interference fit with respect to the protrusion 204 such that adhesive is not necessary and the AC bias coil 206 may be sufficiently held in place relative to the mold material 200 by the interference fit when the subassembly, including the mold material 200, lead frame 198 and die 192, are placed into the mold cavity for formation of the mold material 202.

While the sensor 190 is shown to have a protrusion 204 extending only partially through the mold material 202 to terminate before the second end 202b of the second mold material 202, it will be appreciated that a similar sensor including a coil that may be (although is not required to be) concentrically disposed with respect to a protrusion of the non-conductive mold material can be provided with a protrusion of the type which extends to the second end 202b of the mold material 202.

The second mold material 202 is tapered from a first end 202a proximate to the lead frame 198 to a second end 202b distal from the lead frame. The second mold material 202 is tapered along both its outer circumferential surface 208a and its inner surface 208b from its first end 202a to its second end 202b. Here again, the angle of taper of the surface 208a may be on the order of less than 15-20 degrees. The angle of the taper of the inner surface 208b may be the same as or similar to the angle of the taper of the outer surface 208a.

The second mold material 202 has a non-contiguous central region, here in the form of a central aperture defined by the inner surface 203b. This non-contiguous central region of the ferromagnetic mold material 202 may take various shapes, so as to form a O-shaped, D-shaped, C-shaped, or U-shaped structure as examples.

The sensor 190 may, optionally, include a third mold material 210 in the form of an overmold in order to protect and electrically insulate the device. The third mold material 210 may be applied during a third molding step/process or alternatively by any suitable fabrication method. The overmold 210 is considered optional because its purpose is to provide electrical insulation and, in embodiments in which the ferromagnetic mold material 202 is sufficiently electrically insulative (e.g., provides more than approximately 1 megaohm of resistance in certain applications), the overmold 210 may be eliminated. It will be appreciated that the overmold 210 may be provided for the sensor of FIG. 8 and other embodiments. Suitable materials for providing the overmold material 210 include, but are not limited to standard die encapsulation mold compounds such as PPS, nylon, SUMIKON®EME of Sumitomo Bakelite Co., Ltd., or Hysol® mold compounds of Henkel AG & Co. KGaA.

The second mold material can be provided in the form of a non-conductive material or ferromagnetic material such as a soft ferromagnetic material or hard ferromagnetic material. For example, in embodiments in which the material is a soft ferromagnetic material, the magnetic field generated by the coil can be focused or otherwise concentrated as desired by the soft ferromagnetic mold material. Alternatively, in embodiments in which the material is a hard ferromagnetic material, the magnetic field provided by the coil can be used to modulate the magnetic field provided by the hard ferromagnetic material, in order to thereby reduce the peak current otherwise required to provide the same magnetic field strength with just the coil (i.e., if the hard ferromagnetic mold material were not present).

Since the back bias functionality is provided by the AC bias coil, the second mold portion/material may be eliminated entirely (as is shown in FIG. 10) in which case the non conductive mold material with the AC bias coil attached to its surface can be packaged to provide the resulting sensor IC. Such an arrangement can be provided in a package of the type described in a U.S. Pat. No. 6,265,865 or a U.S. Pat. No. 5,581,179, each of which is assigned to the Assignee of the subject application and incorporated herein by reference in its entirety.

In applications including the second mold portion/material, such mold material may be tapered from a first end proximate to the lead frame to a second end distal from the lead frame (or for some portion thereof) and the sensor may, optionally, include a third mold material in the form of an overmold in order to protect and electrically insulate the device, as discussed above with respect to the sensor 190 of FIG. 9.

Referring to FIG. 10, an alternative magnetic field sensor 220 includes a semiconductor die 222 having a first active surface 222a in which a magnetic field sensing element 224 is disposed and a second, opposing surface 222b attached to a die attach area 226 on a first surface 228a of a lead frame 228 and a non-conductive mold material 230 enclosing the die and at least a portion of the lead frame.

The sensor 220 includes an AC bias coil 232 that may the same as or similar to the coils of FIGS. 8-9. The AC bias coil 232 is secured to, and more particularly, in the embodiment of FIG. 10 is enclosed by, the non-conductive mold material 230. The wire of the coil 232 may be wound around a mandrel or bobbin 234, as shown. In one illustrative embodiment, the mandrel 234 may be comprised of a soft ferromagnetic material or a plastic and remain part of the final device. In other embodiments, the mandrel 234 is used during coil winding but then not made a part of the final package, for example in the case of FIGS. 8-9. The mandrel 234 and AC bias coil 232 may be secured to the surface 228b of the lead frame 228 that is opposite the die 222 with an adhesive or other securing mechanism such that the AC bias coil 222 is secured to the lead frame 228 when the subassembly is placed in a mold cavity and the non-conductive mold material 230 is formed.

Additional details or alternative techniques for providing a package with one or multiple mold materials, as illustrated in FIGS. 8-10, in particular, examples for suitable types of molding processes and mold material securing mechanisms, may be had with reference to U.S. patent application Ser. No. 13/748,999, filed Jan. 24, 2013 and entitled "Magnetic Field Sensor Integrated Circuit with Integral Ferromagnetic Material," which is assigned to the Assignee of the subject application and incorporated herein by reference in its entirety. Other examples of securing mechanisms include the use of an adhesive material and/or various other features designed to provide interference and/or an interlocking mechanism between the mold materials.

The AC signal may be provided to the coil through extra pins, allowing an external connection to the coil. Alternatively, the AC signal could be provided through connections to the die. For example, a wire coupled to a coil terminal could be soldered to the die or connected to the die via wire bonds. In an alternative embodiment, a portion of the lead frame could be used to connect to the coil wire and to the die (e.g., via a wire bond). These connection areas of the lead frame could be unconnected to the remainder of the lead frame after molding and trimming. Any other suitable connecting means could be used.

Figure 11:
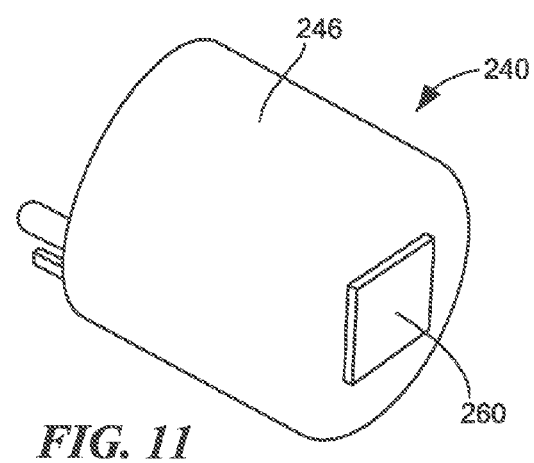
FIG. 11 shows a perspective view of a magnetic field sensor assembly having a packaged magnetic field sensor integrated circuit and separate coil unit enclosed in a housing.
Figure 12:
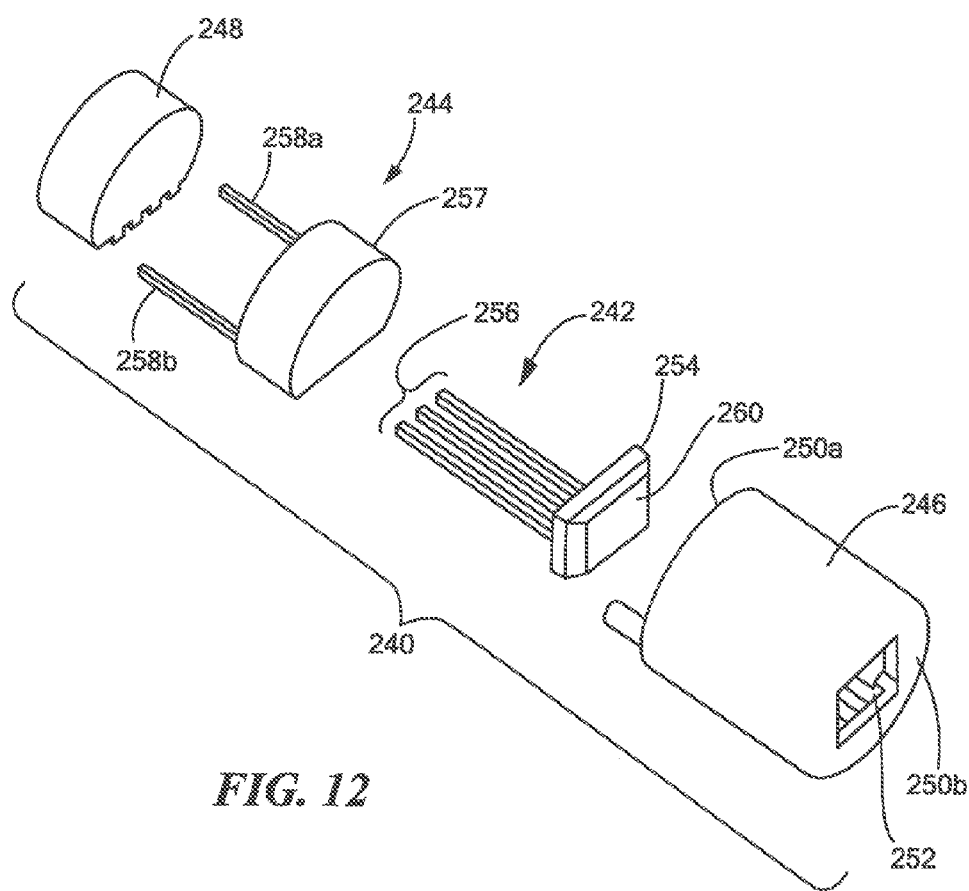
FIG. 12 shows an exploded view of the magnetic field sensor assembly shown in FIG. 11.

FIGS. 11-12 illustrate yet another type of packaging for a magnetic field sensor with an AC bias coil. Referring to FIG. 11 in conjunction with FIG. 12, a magnetic field sensor assembly 240 includes a packaged magnetic field sensor IC 242, a coil unit 244, and a housing having a case (or housing shell) 246 and an end cap 248. The case 246 has a first end 250a with an opening (not shown) and a second end 250b that includes a window 252. When each of these elements is serially placed through the opening 250a of the case 246 (in the order of sensor IC 242, then coil unit 244 followed by the end cap 248, as shown in the exploded view of FIG. 12), the "fully assembled" magnetic field sensor assembly 240 takes on the form shown in the configuration shown in FIG. 11. Although the housing is shown as a two-piece housing having a generally cylindrical shape, other types of housings could be used as well. The packaged magnetic field sensor IC 242 is shown to include a first package portion 254 corresponding to a magnetic field sensor chip within a protective package body and a second package portion, in the form of conductive leads 256. There may be three conductive leads 256, with a lead, to correspond to the power and ground connections and a lead for the output signal (as shown in the embodiments of FIGS. 3 and 6, for a "three-wire" device), or some other number of leads. The coil unit 244 may include a coil body portion 257 containing an AC bias coil (which can be, e.g., a spiral coil, a solenoid type coil, solenoid type coil with a soft ferromagnetic core, or other type of coil configuration) and conductive leads 258a and 258b. Materials for the entire coil body portion 257 (exclusive of the internal coil) may include plastic (or other mold compound) or non-ferromagnetic material. Alternatively, for a coil unit design that integrates a magnetic flux concentrator or guide, the top of the coil body portion 257 (i.e., the part between the coil and the sensing element of the sensor 242 IC) could be made of plastic (or other mold compound) or non-ferromagnetic material, and the sides and bottom of the coil body portion 257 could be made of a soft ferromagnetic material to help reduce the reluctance path, i.e., guide the magnetic flux more efficiently. One of the leads, lead 258a, is an AC signal input for connecting to the AC signal source (e.g., coil input line 26, shown in FIG. 1) and the other lead, e.g., lead 258b, is a ground terminal for connecting to ground. The coil of coil unit 244 may be driven in electrical isolation from the sensor IC 242 with no common node. If, however, the sensor IC ground and the coil unit ground are to be tied together, then the assembly 240 could be designed to have one less pin/lead for external connections. In the assembly 240, the leads 256 of the packaged sensor IC and leads 258 of the coil unit 244 extend outwardly from the opening in the first end 250a of the case 246. The first package portion 254 is positioned in the case 246 part way through the window 252 so that a first body face 260 extends outwardly from second end 250b of the case 246. When the sensor assembly 240 is mounted in an application, the first body face 260 will be positioned in proximity to the target's profile. The illustrative housing of FIGS. 11-12 can be constructed according to techniques like those described in the above-referenced U.S. Pat. No. 5,581,179, or other suitable techniques. The case 246 can be formed of a polymeric insulating material, as described in the aforementioned patent, or, alternatively, a soft ferromagnetic material. In other embodiments, a separate magnetic flux concentrator may be included in the assembly.

The AC bias sensing arrangement of FIG. 1 could be implemented at the application level with separately packaged coil and sensor components as well. The AC bias coil could be encased in a housing made of any suitable material, provided the top surface of the housing facing the sensing element is not shielding or blocking the flux generated by the coil. In some embodiments, at least that top surface may be a plastic (or other mold compound) material or non-ferromagnetic material. In other embodiments, a portion of the housing could be made of a soft ferromagnetic material. The soft ferromagnetic material would act as a flux guide to lower the reluctance path and increase the magnetic flux for some designs. The sensor could be packaged in any suitable type of package, such as SIP or Small Outline IC (SOIL). In such an arrangement, the AC bias coil can be positioned in proximity to the ferromagnetic target and magnetic field sensor. If a back-biasing arrangement is desired, the magnetic field sensor will be located between the AC bias coil and the ferromagnetic target.

Other embodiments incorporating these concepts may be used as well. For example, it will be appreciated by those of ordinary skill in the art that the package types, shapes, and dimensions, including but not limited to the thicknesses of the mold materials, can be readily varied to suit a particular application both in terms of the electrical and magnetic requirements as well as any packaging considerations.

Also, while the AC biasing approach described herein is primarily shown and described in conjunction with sensing elements detecting rotations of a toothed ferromagnetic gear, it is generally applicable to any magnetic field sensing application that utilizes a biasing magnetic field. For example, the target to be sensed could be a linear motion device.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor comprising:
   a coil driver circuit to generate an AC signal;
   an AC bias coil coupled to the coil driver circuit to receive the AC signal and to generate an AC bias magnetic field modulated by movement of a ferromagnetic target having a target profile pattern with respect to the AC bias coil;
   a magnetic field signal generator comprising at least one sensing element to produce, by sensing the modulated AC bias magnetic field, a magnetic field signal indicative of the movement of the ferromagnetic target, the magnetic field signal having a modulated signal portion in a first frequency band based on the sensed modulated AC bias magnetic field and an unwanted signal portion in a second frequency band based on sensing an external magnetic interference;
   circuitry including a demodulator to perform a demodulation of the magnetic field signal, wherein the magnetic field signal generator and circuitry are provided on a semiconductor die, further comprising a package that includes a lead frame coupled to the semiconductor die and located between the semiconductor die and the AC bias coil, and further includes a mold portion to enclose the semiconductor die, at least a portion of the lead frame and the AC bias coil together; and
   wherein the demodulation results in the modulated signal portion being shifted from the first frequency band to a third frequency band and the unwanted signal portion being shifted to the first frequency band from the second frequency band.

2. The magnetic field sensor of claim 1, wherein the third frequency band comprises DC.

3. The magnetic field sensor of claim 1, wherein the demodulator further includes a filter to remove the unwanted signal portion from the magnetic field signal after the unwanted signal portion has been shifted to the first frequency band.

4. The magnetic field sensor of claim 3, wherein the circuitry produces a sensor output signal based on the magnetic field signal after demodulation.

5. The magnetic field sensor of claim 1, wherein the coil driver is coupled between a supply input and the AC bias coil, to provide the AC signal to the AC bias coil.

6. The magnetic field sensor of claim 5, further comprising a frequency select input, coupled to the coil driver, to allow the frequency of the AC signal to be adjusted by an external application.

7. The magnetic field sensor of claim 5, further comprising a frequency controller, coupled to the coil driver, to provide a frequency select signal based on a frequency selection to the coil driver for adjusting the frequency of the AC signal.

8. The magnetic field sensor of claim 7, wherein the frequency controller is configured to receive the magnetic field signal after demodulation following multiple frequency adjustments, and modify the frequency selection in response thereto.

9. The magnetic field sensor of claim 1, wherein a frequency at which the AC bias magnetic field is generated is set so that the first frequency band excludes frequencies associated with the magnetic interference in the second frequency band.

10. The magnetic field sensor of claim 1, wherein the AC bias coil comprises a solenoid type coil.

11. The magnetic field sensor of claim 10, wherein the solenoid type coil comprises a soft ferromagnetic core to concentrate the AC bias magnetic field.

12. The magnetic field sensor of claim 1, wherein the mold portion comprises a first mold portion to enclose the die and at least a portion of the lead frame and a second mold portion to enclose the AC bias coil.

13. The magnetic field sensor of claim 12, wherein the second mold portion comprises a ferromagnetic mold material.

14. The magnetic field sensor of claim 1, wherein the at least one sensing element is a selected one of a Hall-effect element, magnetoresistance (MR) element or other type of magnetic field sensitive element.

15. The magnetic field sensor of claim 14, wherein material used to implement the at least one sensing element is a selected one of type IV semiconductor material or a type III-V semiconductor material.

16. A magnetic field sensor comprising:
a coil driver circuit to generate an AC signal;
an AC bias coil coupled to the coil driver circuit to receive the AC signal and to generate an AC bias magnetic field modulated by movement of a ferromagnetic target having a target profile pattern with respect to the AC bias coil;
a magnetic field signal generator comprising at least one sensing element to produce, by sensing the modulated AC bias magnetic field, a magnetic field signal indicative of the movement of the ferromagnetic target, the magnetic field signal having a modulated signal portion in a first frequency band based on the sensed modulated AC bias magnetic field and an unwanted signal portion in a second frequency band based on sensing an external magnetic interference;
circuitry including a demodulator to perform a demodulation of the magnetic field signal, wherein the demodulation results in the modulated signal portion being shifted from the first frequency band to a third frequency band and the unwanted signal portion being shifted to the first frequency band from the second frequency band; and
wherein the AC bias coil, magnetic field signal generator and circuitry are provided on a semiconductor die.

17. The magnetic field sensor of claim 16, wherein the AC bias coil comprises a planar spiral coil.

18. The magnetic field sensor of claim 17, wherein the sensing element comprises at least one spin-valve, AMR, GMR, TMR, or MTJ type sensing element.

19. The magnetic field sensor of claim 17, further comprising wherein the coil driver is coupled between a supply input and the AC bias coil, to provide the AC signal to the AC bias coil.

20. A method, comprising:
providing an AC signal to an AC bias coil by a coil driver circuit coupled to the AC bias coil;
generating with the AC bias coil an AC bias magnetic field modulated by movement of a ferromagnetic target having a target profile pattern with respect to the AC bias coil;
producing, by a magnetic field signal generator sensing the modulated AC bias magnetic field, a magnetic field signal indicative of the movement of the ferromagnetic target having the target profile pattern, the magnetic field signal comprising a modulated signal portion in a first frequency band based on sensing the modulated AC bias magnetic field and an unwanted signal portion in a second frequency band based on sensing an external magnetic interference; and
performing, by circuitry, a demodulation of the magnetic field signal to shift the modulated signal portion from the first frequency band to a third frequency band and the unwanted signal portion to the first frequency band from the second frequency band, wherein the magnetic field signal generator and circuitry are provided on a semiconductor die, further comprising a package that includes a lead frame coupled to the semiconductor die and located between the semiconductor die and the AC bias coil, and further includes a mold portion to enclose the semiconductor die, at least a portion of the lead frame and the AC bias coil together.

21. The method of claim 20, wherein the third frequency band comprises DC.

22. The method of claim 20, wherein performing the demodulation further comprises filtering to remove the unwanted signal portion from the magnetic field signal after the unwanted signal portion has been shifted to the first frequency band.

23. The method of claim 22, further comprising:
producing an output signal based on the magnetic field signal after demodulation.

24. The method of claim 20, wherein the AC signal has a frequency that is an adjustable frequency.

25. The method of claim 24, further comprising:
setting the frequency of the AC signal so that the first frequency band excludes frequencies associated with the magnetic interference in the second frequency band.

26. A method, comprising:
providing an AC signal to an AC bias coil by a coil driver circuit coupled to the AC bias coil;
generating with the AC bias coil an AC bias magnetic field modulated by movement of a ferromagnetic target having a target profile pattern with respect to the AC bias coil;

producing, by a magnetic field signal generator sensing the modulated AC bias magnetic field, a magnetic field signal indicative of the movement of the ferromagnetic target having the target profile pattern, the magnetic field signal comprising a modulated signal portion in a first frequency band based on sensing the modulated AC bias magnetic field and an unwanted signal portion in a second frequency band based on sensing an external magnetic interference; and performing, by circuitry, a demodulation of the magnetic field signal to shift the modulated signal portion from the first frequency band to a third frequency band and the unwanted signal portion to the first frequency band from the second frequency band, wherein the AC bias coil, magnetic field signal generator and circuitry are provided on a semiconductor die.

27. A magnetic field sensor comprising:

means for providing an AC signal;

means for generating an AC bias magnetic field responsive to the AC signal and modulated by movement of a ferromagnetic target having a target profile pattern with respect to the means for generating;

means for producing, by sensing the modulated AC bias magnetic field, a magnetic field signal indicative of the movement of the ferromagnetic target having the target profile pattern, the magnetic field signal comprising a modulated signal portion in a first frequency band based on sensing the modulated AC bias magnetic field and an unwanted signal portion in a second frequency band based on sensing an external magnetic interference; and means for performing a demodulation of the magnetic field signal to shift the modulated signal portion from the first frequency band to a third frequency band and the unwanted signal portion to the first frequency band from the second frequency band, wherein the means for generating, the means for producing and the means for performing are provided on a semiconductor die.

* * * * *

UNITED STATES PATENT AND TRADEMARK OFFICE
CERTIFICATE OF CORRECTION

PATENT NO. : 9,664,494 B2
APPLICATION NO. : 13/891519
DATED : May 30, 2017
INVENTOR(S) : Devon Fernandez et al.

It is certified that error appears in the above-identified patent and that said Letters Patent is hereby corrected as shown below:

On the Title Page

Item (57) Abstract, Lines 7-8, delete "of ferromagnetic" and replace with --of a ferromagnetic--

In the Specification

Column 1, Line 58, delete "hiss" and replace with --bias--

Column 2, Line 6, delete "to the that" and replace with --to the first--

Column 2, Line 54, delete "of type" and replace with --of a type--

Column 6, Line 52, delete "to magnetic" and replace with --to the magnetic--

Column 6, Line 53, delete "sources" and replace with --source--

Column 7, Line 50, delete "of magnetic" and replace with --of the magnetic--

Column 8, Line 40, delete "each of the" and replace with --each of: the--

Column 9, Line 32, delete "detector or according" and replace with --detector according--

Column 9, Line 43, delete "inferences" and replace with --interferences--

Column 11, Line 27, delete "provided a" and replace with --provided by a--

Column 11, Lines 32-33, delete "time interval has" and replace with --a time interval has--

Column 11, Line 46, delete "frequencies then" and replace with --frequencies, then--

Signed and Sealed this
Third Day of July, 2018

Andrei Iancu
*Director of the United States Patent and Trademark Office*

CERTIFICATE OF CORRECTION (continued)
U.S. Pat. No. 9,664,494 B2

Column 11, Line 58, delete "output 68," and replace with --i.e., output 68,--

Column 12, Line 46, delete "and or" and replace with --and/or--

Column 13, Line 46, delete "nonconductive" and replace with --non-conductive--

Column 13, Line 55, delete "to the" and replace with --to, the--

Column 15, Line 9, delete "embodiments" and replace with --embodiments,--

Column 15, Line 15, delete "shorting resulting" and replace with --shorting, resulting--

Column 16, Line 15, delete "1821." and replace with --182b.--

Column 16, Lines 20-21, delete "of taper" and replace with --of the taper--

Column 16, Line 23, delete "lead on chip" and replace with --lead-on-chip--

Column 16, Line 52, delete "may the" and replace with --may be the--

Column 17, Line 19, delete "of taper" and replace with --of the taper--

Column 17, Line 25, delete "203b" and replace with --208b--

Column 17, Line 67, delete "in a U.S. Pat. No. 6,265,865 or a U.S." and replace with --in U.S. Pat. No. 6,265,865 or U.S.--

Column 18, Line 19, delete "may the" and replace with --may be the--

Column 19, Line 13, delete "lead, to" and replace with --lead to--

Column 19, Line 45, delete "from second" and replace with --from the second--

Column 20, Line 29, delete "that that" and replace with --that the--